United States Patent
Kagatani et al.

[11] Patent Number: 5,875,114
[45] Date of Patent: Feb. 23, 1999

[54] INTERCONNECT DELAY CALCULATION APPARATUS AND PATH DELAY VALUE VERIFICATION APPARATUS FOR DESIGNING SEMICONDUCTOR INTEGRATED CIRCUIT AND CIRCUIT MODEL DATA STORAGE DEVICE

[75] Inventors: Tatsuji Kagatani; Toshihiro Mani, both of Tokyo, Japan

[73] Assignee: Mitsubishi Denki Kabushiki Kaisha, Tokyo, Japan

[21] Appl. No.: 800,025

[22] Filed: Feb. 13, 1997

[30] Foreign Application Priority Data

Aug. 27, 1996 [JP] Japan ................................. 8-225215

[51] Int. Cl.⁶ ................................................. G06F 17/50
[52] U.S. Cl. ............................................................. 364/489
[58] Field of Search ........................... 364/488, 489, 364/490, 491, 578

[56] References Cited

U.S. PATENT DOCUMENTS

| | | | |
|---|---|---|---|
| 5,469,366 | 11/1995 | Yang et al. | 364/489 |
| 5,617,325 | 4/1997 | Schaefer et al. | 364/488 |
| 5,629,860 | 5/1997 | Jones et al. | 364/490 |
| 5,666,290 | 9/1997 | Li et al. | 364/491 |
| 5,790,415 | 8/1998 | Pullela et al. | 364/489 |

FOREIGN PATENT DOCUMENTS

| | | |
|---|---|---|
| 4-205661 | 7/1992 | Japan . |
| 8-30648 | 2/1996 | Japan . |

OTHER PUBLICATIONS

*On–Line Manual,* Ver. 3.4a, U.S. Synopsys Company, Library Compiler Reference vol. 1, pp. 4.9–4.12.

*Primary Examiner*—Kevin J. Teska
*Assistant Examiner*—Leigh Marie Garbowski
*Attorney, Agent, or Firm*—Burns, Doane, Swecker & Mathis, LLP

[57] ABSTRACT

A circuit model is used which consists essentially of a common portion having an interconnect wire length percentage of A%, and a branch portion having an interconnect wire length percentage of (100–A) % and branched uniformly for each fan-out (n). An interconnect delay calculation apparatus calculates estimated interconnect delay values using data of a coefficient (A) previously determined for each fan-out (n) from past design data by a statistical technique on the basis of a delay calculation expression for the circuit model which is $\{A/100+(100-A)/(100n^2)\}Rw(Cw+Cp)$. The estimated interconnect delay values are calculated accurately when a semiconductor integrated circuit is designed.

13 Claims, 18 Drawing Sheets

F I G. 1 4
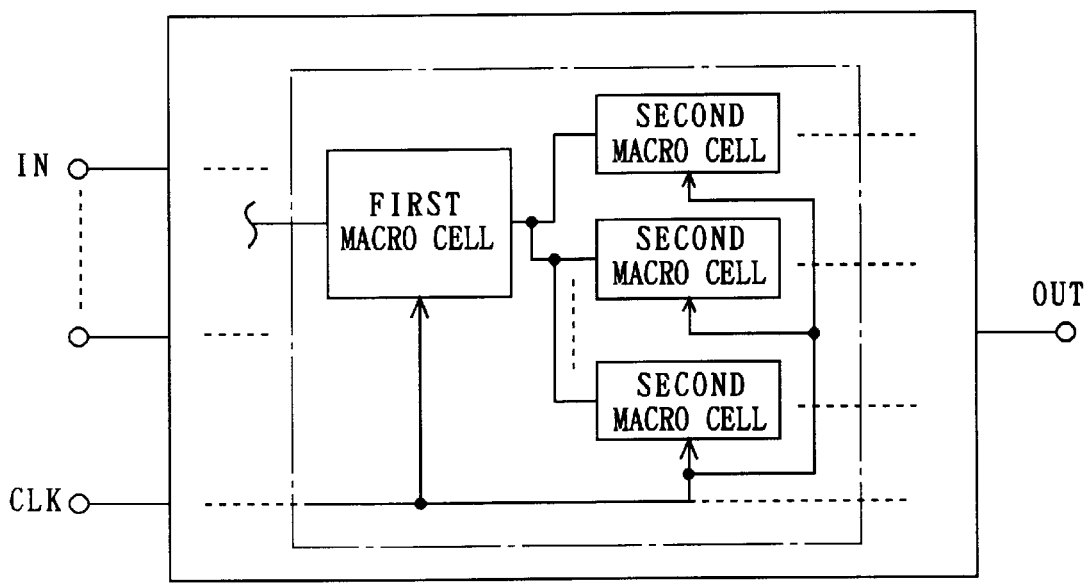
F I G. 1 5
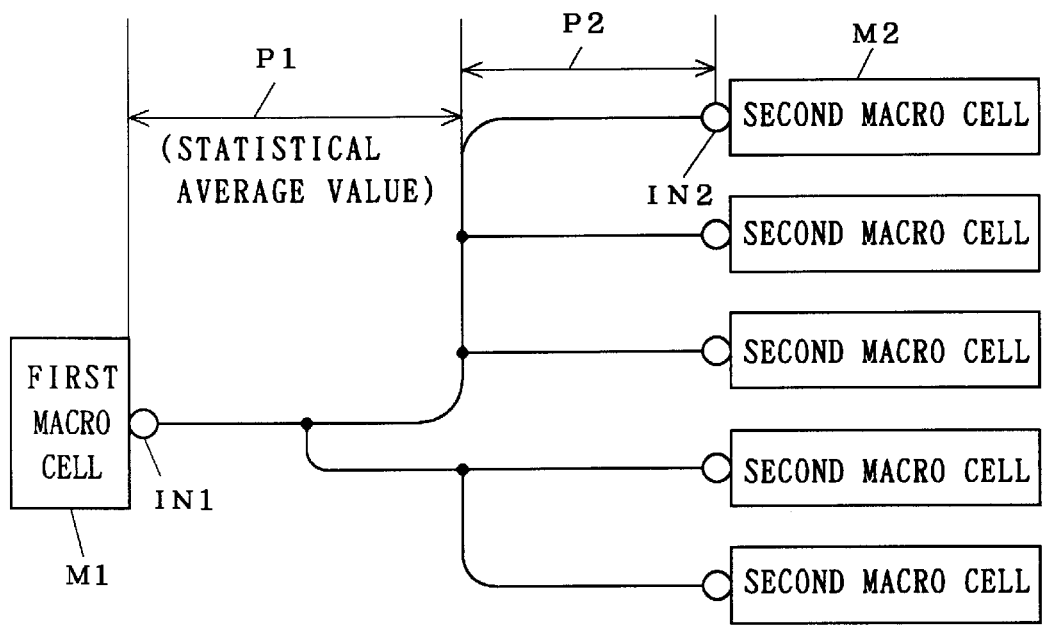

INTERCONNECT DELAY CALCULATION APPARATUS AND PATH DELAY VALUE VERIFICATION APPARATUS FOR DESIGNING SEMICONDUCTOR INTEGRATED CIRCUIT AND CIRCUIT MODEL DATA STORAGE DEVICE

BACKGROUND OF THE INVENTION

1. Field of the Invention

The present invention relates to various apparatus for electrically calculating estimated interconnect delay values in a semiconductor integrated circuit. More particularly, the present invention is widely applicable to previously calculate delay times resulting from interconnect wires for connection between macro cells when a semiconductor integrated circuit including a plurality of macro cells is designed.

The present invention also relates to both software technology used for the apparatus and a medium for storing data necessary to the operation of the apparatus.

2. Description of the Background Art

In the past, only a delay time Tgate of a signal generated in macro cells has been determined and set as an estimated delay value TPD when a semiconductor integrated circuit is designed. An example of such processing is disclosed in Japanese Patent Application Laid-Open No. 8-30648 (1996).

However, the calculation of only the cell delay of the device causes a significant difference between the estimated delay value and an actual delay value provided in the semiconductor integrated circuit. Recently, there has been a shift toward the design technique of calculating an estimated interconnect delay Tline as well as the cell delay Tgate to provide the sum of the estimated interconnect delay Tline and the cell delay Tgate as the estimated delay value TPD (=Tgate+Tline).

Unfortunately, paths and branches of interconnect wires for connecting macro cells and the number of interconnect wires are various and complicated depending upon design. It is hence necessary to set circuit models for calculation of the estimated interconnect delay value Tline. Two circuit models to be described below have been considered.

(Background Art 1)

One of the two circuit models is a circuit model known as "Worst-Case RC Tree" disclosed in the on-line manual (Ver. 3.4a), Library Compiler Reference, Synopsys, U.S.A., Vol. 1, pp.4.9–4.12.

FIG. 16 illustrates such a circuit model. The circuit model of FIG. 16 includes macro cells connected to the extreme end of an interconnect wire and has no interconnect wire branch. In FIG. 16, the reference character Rw designates the total estimated resistance of the interconnect wire; Cw designates the total estimated capacitance of the interconnect wire; Cp designates the sum of pin capacitances of the macro cells to which the interconnect wire is connected. In this circuit model, the estimated interconnect delay value Tline is given by calculation using a delay calculation expression=Rw (Cw+Cp).

FIG. 17 is a functional block diagram of an interconnect delay calculation apparatus for calculating the estimated interconnect delay value Tline on the basis of the circuit model of FIG. 16. In FIG. 17, the reference numeral 1 designates a circuit diagram file for storing data of information (fan-out and the like) of a circuit to be designed when the circuit model illustrated in FIG. 16 is used; and 2 designates a coefficient file portion for filing a coefficient required to calculate an estimated wiring capacitance as a table value. The coefficient file portion 2 contains (1) a wiring resistance per unit interconnect wire length, (2) a wiring capacitance per unit interconnect wire length, and (3) an estimated interconnect wire length for each fan-out, all of which are written therein. For calculation of the estimated interconnect wire length using a linear expression, a coefficient of the linear expression may be set in the coefficient file portion 2 in place of the estimated interconnect wire length for each fan-out.

The reference numeral 3 designates a portion for extracting the pin capacitance of the macro cell to which the interconnect wire is connected; the reference character 3A designates a file portion for storing the respective pin capacitances of a plurality of types of macro cells as a library; 4 designates a portion for calculating the sum of the pin capacitances extracted by the extracting portion 3; 5 designates a portion for extracting the fan-out of the interconnect wire; 6 designates a portion for extracting the coefficient required to calculate the estimated wiring capacitance from the coefficient file portion 2; 7 designates a portion for calculating the estimated wiring capacitance on the basis of the coefficient extracted by the extracting portion 6; 8 designates a portion for extracting a coefficient required to calculate an estimated wiring resistance from the coefficient file portion 2; 9 designates a portion for calculating the estimated wiring resistance on the basis of the coefficient extracted by the extracting portion 8; 10 designates a portion for calculating the estimated interconnect delay value on the basis of the above described delay calculation expression by using the calculated sum of the pin capacitances, the calculated estimated wiring capacitance, and the calculated estimated wiring resistance; and 11 designates an output file portion for storing the calculated estimated interconnect delay value therein. A memory may be used in place of the output file portion 11 to store the estimated interconnect delay value therein.

FIG. 18 is a flow chart illustrating the operation of the interconnect delay calculation apparatus shown in FIG. 17. In FIG. 18 is illustrated the procedure of calculating the estimated delay value of each interconnect wire when the estimated interconnect wire length for each fan-out is set in the coefficient file portion 2.

The calculation procedure comprises extracting the pin capacitance of the macro cell to which the interconnect wire is connected, calculating the sum Cp of the extracted pin capacitances, extracting a fan-out, extracting the estimated interconnect wire length from the coefficient file portion 2 on the basis of the extracted fan-out, extracting the capacitance per unit interconnect wire length, extracting the resistance per unit interconnect wire length, calculating the estimated wiring capacitance Cw from the estimated interconnect wire length and the capacitance per unit interconnect wire length, calculating the estimated wiring resistance Rw from the estimated interconnect wire length and the resistance per unit interconnect wire length, and calculating the estimated delay value of each interconnect wire by the delay calculation expression=Rw (Cw+Cp) using the sum Cp of the pin capacitances, the estimated wiring capacitance Cw and the estimated wiring resistance Rw.

The construction and operation of the interconnect delay calculation apparatus shown in FIGS. 17 and 18 and an interconnect delay calculation apparatus shown in FIGS. 20 and 21 to be described later are considered as being not known in the art.

(Background Art 2)

The second circuit model is known as "Balanced-Case RC Tree" also disclosed in the above described on-line manual. Such a circuit model is shown in FIG. 19. In the circuit model of FIG. 19, it is assumed that only interconnect wire branches are provided between macro cells.

In FIG. 19, the reference character n designates a fan-out; Rw designates the total estimated resistance of the interconnect wire; Cw designates the total estimated capacitance of the interconnect wire; and Cp designates the sum of the pin capacitances of the macro cells to which the interconnect wire is connected. In the circuit model of FIG. 19, the estimated interconnect delay value Tline is given by calculation using a delay calculation expression=$(1/n^2)$ Rw (Cw+Cp).

FIG. 20 is a functional block diagram of an interconnect delay calculation apparatus for calculating the estimated interconnect delay values using the circuit model of FIG. 19. In FIG. 20, the reference numeral 12 designates a circuit diagram file portion for holding data about circuit diagram information (fan-out and the like) when the circuit model shown in FIG. 19 is applied to the interconnect line between macro cells for a circuit to be actually designed; and 13 designates a coefficient file portion. The coefficient file portion 13 contains (1) a wiring resistance per unit interconnect wire length, (2) a wiring capacitance per unit interconnect wire length, and (3) an estimated interconnect line length for each fan-out, all of which are written therein. For calculation of the estimated interconnect wire length using a linear expression, a coefficient of the linear expression may be set in the coefficient file portion 13 in place of the estimated interconnect wire length for each fan-out. The reference numeral 14 designates a portion for extracting the pin capacitance of the macro cell to which the interconnect wire is connected; 15 designates a portion for calculating the sum Cp of the pin capacitances extracted by the extracting portion 14; 16 designates a portion for extracting the fan-out n of the interconnect wire; 17 designates a portion for extracting the coefficient required to calculate the estimated wiring capacitance; 18 designates a portion for calculating the estimated wiring capacitance Cw on the basis of the coefficient extracted by the extracting portion 17; 19 designates a portion for extracting the coefficient required to calculate the estimated wiring resistance; 20 designates a portion for calculating the estimated wiring resistance Rw on the basis of the coefficient extracted by the extracting portion 19; 21 designates a portion for calculating the estimated interconnect delay value Tline from the sum Cp of the pin capacitances, the estimated wiring capacitance Cw, and the estimated wiring resistance Rw on the basis of the above described calculation expression; and 22 designates an output file portion for storing the estimated interconnect delay value therein. Of course, a memory may be used in place of the output file portion 22.

FIG. 21 is a flow chart illustrating the operation of the interconnect delay calculation apparatus shown in FIG. 20. The calculation procedure comprises extracting the pin capacitance of the macro cell to which the interconnect wire is connected, calculating the sum Cp of the extracted pin capacitances, extracting the fun-out n, extracting the estimated interconnect wire length from the coefficient file portion 13 on the basis of the extracted fan-out n, extracting the capacitance per unit interconnect wire length, extracting the resistance per unit interconnect wire length, calculating the estimated wiring capacitance Cw from the estimated interconnect wire length and the capacitance per unit interconnect wire length, calculating the estimated wiring resistance Rw from the estimated interconnect wire length and the resistance per unit interconnect wire length, and calculating the estimated delay value of each interconnect wire by the above described delay calculation expression=$(1/n^2)$ Rw (Cw+Cp) using the sum Cp of the pin capacitances, the estimated wiring capacitance Cw, the estimated wiring resistance Rw, and the fan-out n.

In the conventional art circuit models, it is assumed that the interconnect wire between the macro cells has no interconnect wire branches as shown in FIG. 16 and that the interconnect wire between the macro cells is comprised of only interconnect wire branches as shown in FIG. 19. Calculation of the estimated interconnect delay values using such circuit models which are poles apart results in very low accuracy of the estimated interconnect delay values.

More specifically, the circuit model of "Worst Case RC Tree" presents a pronounced problem in that the estimated interconnect delay value calculated using the model during the design is constantly much greater than the interconnect delay value determined from the actually manufactured circuit. This problem may be expressed in different words that a great design margin is set in the circuit model of FIG. 16. Such a design margin is advantageous when the operating rate of the circuit is relatively low. However, the circuit model having an excessive design margin yields undesired results in the design technique of semiconductor integrated circuits under the recent tendency toward higher and higher operating rates of the circuit. That is, the increase in interconnect delay time for each interconnect wire length set using the circuit model of Background Art 1 finally results in the unsatisfactory specs of the whole semiconductor integrated circuit. In this case, the user must extract suitable portions of the designed interconnect wires to re-design the portions so that the specs of the whole semiconductor integrated circuit are completely satisfactory, resulting in an inefficient and complicated process for designing the circuit.

On the other hand, the circuit model of "Balanced-Case RC Tree" depicted in FIG. 19 presents a problem in that the interconnect delay value calculated using the circuit model is constantly less than the actual delay value. If the estimated interconnect delay value of each interconnect wire length set using the circuit model of FIG. 19 satisfies the specs during the design phase, the actual products do not satisfy the specs, and the semiconductor integrated circuit fails to operate. Thus, the design using the circuit model of FIG. 19 poses a significant risk. This problem is considered to result from the passive design principle of considering the interconnect delay for the time being for design as a result of the interconnect delay value which has been regarded as zero but becomes non-negligible with the size reduction of the interconnect wires.

SUMMARY OF THE INVENTION

A first aspect of the present invention is intended for an interconnect delay calculation apparatus for calculating estimated interconnect delay values for an interconnect wire length when an output of a first macro cell is connected to inputs of n second macro cells (n≧1) in designing a semiconductor integrated circuit. According to the present invention, the interconnect delay calculation apparatus comprises: storage means for electrically storing therein predetermined data about a circuit model designed for the interconnect wire length and consisting essentially of a common portion and a branch portion with a fan-out of n, the common portion having a first resistance connected between the output of the first macro cell and a branch point, and a first capacitance connected between the branch point and ground, the branch portion including branch interconnect wires for connecting the branch point to the n second macro cells, respectively, and uniformly branched for the fan-out of n, each of the branch interconnect wires having a second resistance connected between the branch point and the input of a corresponding one of the second macro cells, a second capacitance serving as a parasitic capacitance and connected between the input of the corresponding one of the second macro cells and the ground, and a pin capacitance connected between the input of the corresponding one of the second macro cells and the ground, and calculating means for electrically calculating the estimated interconnect delay values using a predetermined delay calculation expression specified by time constants of the first and second resistances, the first and second capacitances, and the pin capacitance on the basis of the predetermined data extracted from the storage means.

The storage means electrically stores the predetermined data about the circuit model therein. Then, the calculating means electrically extracts the predetermined data from the storage means to electrically execute the delay calculation expression determined by the setting of the circuit model on the basis of the predetermined data to provide the estimated interconnect delay values as design data. This permits the calculation of the estimated interconnect delay values for the interconnect wire length based on the circuit model. Since the above described circuit model is closer to the model having a structure of an actual interconnect wire between macro cells, the estimated interconnect delay values much closer to the interconnect delay values of the actual circuit are provided during the design phase.

Preferably, according to a second aspect of the present invention, the lengths of the common portion and the branch portion are defined on a percentage basis respectively as a first coefficient and 100 minus the first coefficient, based upon the interconnect wire length of the circuit model; the first resistance, the second resistance, the first capacitance, and the second capacitance are defined respectively as the first coefficient times an estimated wiring resistance divided by 100, the quantity 100 minus the first coefficient times the estimated wiring resistance divided by 100n, the first coefficient times an estimated wiring capacitance divided by 100, and the quantity 100 minus the first coefficient times the estimated wiring capacitance divided by 100n; the storage means comprises first storage means for storing therein circuit diagram data when the circuit model is applied to the interconnect wire length to be designed for the semiconductor integrated circuit, second storage means for storing therein data about the pin capacitance for a plurality of types of semiconductor devices usable as the second macro cells as a library, and third storage means for storing therein first coefficient table data indicative of information about the first coefficient, second coefficient table data indicative of a wiring resistance per unit interconnect wire length, third coefficient table data indicative of a wiring capacitance per unit interconnect wire length, and fourth coefficient table data indicative of an estimated interconnect wire length for each fan-out, the circuit diagram data comprising both data about type information and pin information of the second macro cells contained in the interconnect wire length to be designed, and data about the fan-out of the interconnect wire length to be designed, the estimated interconnect wire length being equal to the sum of the length of the common portion and the length of the branch portion, the first and fourth coefficient table data being previously determined by a statistical technique; and the calculating means comprises first extracting means for extracting the data about the type information and the pin information of the second macro cells from the first storage means to extract the pin capacitance data of the second macro cells from the second storage means on the basis of the extracted data, first calculating means for electrically calculating the sum of the pin capacitance data extracted from the first extracting means, second extracting means for extracting the fan-out data from the first storage means, second calculating means for extracting corresponding ones of the first, second, third, and fourth coefficient table data from the third storage means on the basis of the fan-out data extracted by the second extracting means to electrically determine the extracted second, third, and fourth coefficient table data as second, third, and fourth coefficient data, respectively, to electrically calculate data of the estimated wiring resistance and data of the estimated wiring capacitance on the basis of the multiplication of the second and fourth coefficient data and the multiplication of the third and fourth coefficient data, respectively, and to electrically determine first coefficient data indicative of the first coefficient for the interconnect wire length to be designed on the basis of the first coefficient table data, and third calculating means for electrically calculating the estimated interconnect delay values on the basis of output signals from the first and second calculating means by using the predetermined delay calculation expression specified based on the first coefficient data, the estimated wiring resistance data, the estimated wiring capacitance data, the pin capacitance sum data, and the fan-out data.

Preferably, according to a third aspect of the present invention, the first coefficient table data are previously determined for each fan-out by the statistical technique; and the second calculating means comprises first coefficient determining means for selecting the presence/absence of the first coefficient table data corresponding to the fan-out on the basis of the fan-out data, the first coefficient determining means electrically determining the first coefficient table data as the first coefficient data required for calculation when the corresponding first coefficient table data are present, the first coefficient determining means electrically determining the first coefficient data required for calculation by electrical processing using linear interpolation when the corresponding first coefficient table data are absent.

Preferably, according to a fourth aspect of the present invention, the first coefficient table data are comprised of only constant data common to any fan-out and determined previously by the statistical technique; and the second calculating means comprises first coefficient determining means for selecting the first coefficient table data on the basis of the fan-out data to electrically determine the first coefficient table data as the first coefficient data required for calculation.

Preferably, according to a fifth aspect of the present invention, the pin capacitance of each of the second macro cells in the circuit model is given by the pin capacitance sum data divided by the fan-out data; and the third calculating means comprises estimated interconnect delay value calculating means for electrically calculating the estimated interconnect delay values on the basis of the output signals from the first and second calculating means by using the predetermined delay calculation expression specified by the first coefficient data, the estimated wiring resistance data, the estimated wiring capacitance data, the pin capacitance sum data divided by the fan-out data, and the fan-out data.

Preferably, according to a sixth aspect of the present invention, the pin capacitance of each of the second macro cells in the circuit model is given by the pin capacitance sum data divided by the fan-out data; and the third calculating means comprises estimated interconnect delay value calculating means for electrically calculating the estimated interconnect delay values on the basis of the output signals from the first and second calculating means by using the predetermined delay calculation expression specified by the first coefficient data, the estimated wiring resistance data, the estimated wiring capacitance data, the pin capacitance sum data divided by the fan-out data, and the fan-out data.

Preferably, according to a seventh aspect of the present invention, the pin capacitance of each of the second macro cells in the circuit model is given by the pin capacitance sum data divided by the fan-out data; and the third calculating means comprises estimated interconnect delay value calculating means for electrically calculating the estimated interconnect delay values on the basis of the output signals from the first and second calculating means by using the predetermined delay calculation expression specified by the first coefficient data, the estimated wiring resistance data, the estimated wiring capacitance data, the pin capacitance sum data divided by the fan-out data, and the fan-out data.

Preferably, according to an eighth aspect of the present invention, the pin capacitance of each of the second macro cells in the circuit model is given by corresponding ones of the pin capacitance data extracted by the first extracting means; and the third calculating means comprises estimated interconnect delay value calculating means for electrically calculating each of the estimated interconnect delay values on the basis of the output signals from the first and second calculating means and an output signal of each of the pin capacitance data extracted by the first extracting means by using the predetermined delay calculation expression specified based on the first coefficient data, the estimated wiring resistance data, the estimated wiring capacitance data, the pin capacitance sum data, the fan-out data, and each of the pin capacitance data.

Preferably, according to a ninth aspect of the present invention, the pin capacitance of each of the second macro cells in the circuit model is given by corresponding ones of the pin capacitance data extracted by the first extracting means; and the third calculating means comprises estimated interconnect delay value calculating means for electrically calculating each of the estimated interconnect delay values on the basis of the output signals from the first and second calculating means and an output signal of each of the pin capacitance data extracted by the first extracting means by using the predetermined delay calculation expression specified based on the first coefficient data, the estimated wiring resistance data, the estimated wiring capacitance data, the pin capacitance sum data, the fan-out data, and each of the pin capacitance data.

Preferably, according to a tenth aspect of the present invention, the pin capacitance of each of the second macro cells in the circuit model is given by corresponding ones of the pin capacitance data extracted by the first extracting means; and the third calculating means comprises estimated interconnect delay value calculating means for electrically calculating each of the estimated interconnect delay values on the basis of the output signals from the first and second calculating means and an output signal of each of the pin capacitance data extracted by the first extracting means by using the predetermined delay calculation expression specified based on the first coefficient data, the estimated wiring resistance data, the estimated wiring capacitance data, the pin capacitance sum data, the fan-out data, and each of the pin capacitance data.

An eleventh aspect of the present invention is intended for a path delay value verification apparatus for functioning to calculate a path delay value of a semiconductor integrated circuit when the semiconductor integrated circuit is designed, the path delay value verification apparatus comprising an interconnect delay calculation apparatus, the path delay value verification apparatus using the interconnect delay calculation device to electrically calculate estimated interconnect delay values of individual interconnect wire lengths in the semiconductor integrated circuit, the interconnect delay calculation apparatus calculating estimated interconnect delay values for an interconnect wire length when an output of a first macro cell is connected to inputs of n second macro cells (n≧1) in designing the semiconductor integrated circuit. According to the present invention, the interconnect delay calculation apparatus comprises: storage means for electrically storing therein predetermined data about a circuit model designed for the interconnect wire length and consisting essentially of a common portion and a branch portion with a fan-out of n, the common portion having a first resistance connected between the output of the first macro cell and a branch point, and a first capacitance connected between the branch point and ground, the branch portion including branch interconnect wires for connecting the branch point to the n second macro cells, respectively, and uniformly branched for the fan-out of n, each of the branch interconnect wires having a second resistance connected between the branch point and the input of a corresponding one of the second macro cells, a second capacitance serving as a parasitic capacitance and connected between the input of the corresponding one of the second macro cells and the ground, and a pin capacitance connected between the input of the corresponding one of the second macro cells and the ground, and calculating means for electrically calculating the estimated interconnect delay values using a predetermined delay calculation expression specified by time constants of the first and second resistances, the first and second capacitances, and the pin capacitance on the basis of the predetermined data extracted from the storage means.

A twelfth aspect of the present invention is intended for a circuit model data storage device for electrically holding predetermined data for calculating estimated interconnect delay values of a semiconductor integrated circuit. According to the present invention, the predetermined data are data indicative of respective portions of a circuit model; the circuit model is designed for an interconnect wire length when an output of a first macro cell is connected to inputs of n second macro cells (n≧1), and consists essentially of a common portion and a branch portion with a fan-out of n, the common portion having a first resistance connected between the output of the first macro cell and a branch point, and a first capacitance connected between the branch point and ground, the branch portion including branch interconnect wires for connecting the branch point to the n second macro cells, respectively, and uniformly branched for the fan-out of n, each of the branch interconnect wires having a second resistance connected between the branch point and the input of a corresponding one of the second macro cells, a second capacitance serving as a parasitic capacitance and connected between the input of the corresponding one of the second macro cells and the ground, and a pin capacitance connected between the input of the corresponding one of the second macro cells and the ground; and the data indicative of the respective portions correspond to data about the first and second resistances, the first and second capacitances, the pin capacitance, the fan-out, and the proportions of the common portion and the branch portion, based upon the interconnect wire length.

Preferably, according to a thirteenth aspect of the present invention, the lengths of the common portion and the branch portion are defined on a percentage basis respectively as a first coefficient and 100 minus the first coefficient, based upon the interconnect wire length of the circuit model; the first resistance, the second resistance, the first capacitance, and the second capacitance are defined respectively as the first coefficient times an estimated wiring resistance divided by 100, the quantity 100 minus the first coefficient times the estimated wiring resistance divided by 100n, the first coefficient times an estimated wiring capacitance divided by 100, and the quantity 100 minus the first coefficient times the estimated wiring capacitance divided by 100n; and the predetermined data comprise circuit diagram data, data about the pin capacitance for a plurality of types of semiconductor devices usable as the second macro cells, first coefficient table data indicative of information about the first coefficient, second coefficient table data indicative of a wiring resistance per unit interconnect wire length, third coefficient table data indicative of a wiring capacitance per unit interconnect wire length, and fourth coefficient table data indicative of an estimated interconnect wire length for each fan-out, the circuit diagram data comprising both data about type information and pin information of the second macro cells contained in the interconnect wire length to be designed, and data about the fan-out of the interconnect wire length to be designed, the estimated interconnect wire length being equal to the sum of the length of the common portion and the length of the branch portion, the first and fourth coefficient table data being previously determined by a statistical technique.

In accordance with the first to tenth aspects of the present invention, the estimated interconnect delay values may be electrically calculated using the circuit model having a structure closer to the structure of an interconnect wire between macro cells of an actual circuit than that of the conventional model. The calculated estimated interconnect delay values are much closer to the measured interconnect delay values for the interconnect wire length of the actual circuit. The present invention permits a dramatically improved the interconnect delay calculation accuracy during the design phase over the accuracy provided using the conventional circuit model, and provides the interconnect delay calculation apparatus which achieves high-accuracy design when the operating speed of the semiconductor integrated circuit is increased.

In accordance with the second aspect of the present invention, the first coefficient data for determining the proportions of the common portion and the branch portion in the circuit model may be determined by statistical technique using the past design data, achieving the structure of the circuit model closer to the structure having the interconnect wire length of the actual circuit. Additionally, the first and second resistances and the first and second capacitances are determined using the estimated wiring resistance and the estimated wiring capacitance as well as the first coefficient. The estimated wiring resistance and the estimated wiring capacitance are determined by the respective data of (1) the wiring resistance per unit interconnect wire length, (2) the wiring capacitance per unit interconnect wire length, and (3) the estimated interconnect wire length. These data (1) to (3) are also fixedly determined depending upon the manufacturing process and semiconductor devices to be used, or determined by the statistical technique using the past design data. This permits the use of the circuit model of the present invention based on the past design data and the delay calculation expression derived from the circuit model, ensuring the enhancement of the calculation accuracy.

In accordance with the third aspect of the present invention, the first coefficient data are determined for each fan-out using the statistical technique, ensuring the enhancement of the calculation accuracy of the estimated interconnect delay values.

In accordance with the fourth aspect of the present invention, the calculation step is simplified while the calculation accuracy provided in the third aspect is maintained. This permits the estimated interconnect delay values to be calculated at higher speeds.

In accordance with the fifth to seventh aspects of the present invention, the data of the individual pin capacitances in the circuit model are calculated as the average value. This provides a simpler delay calculation expression than that of the eighth to tenth aspects and, accordingly, provides the technique of calculating the estimated interconnect delay values available for more practical use.

In accordance with the eighth to tenth aspects of the present invention, the use of the respective pin capacitances in the circuit model permits the estimated interconnect delay values to be calculated with higher accuracy than the first to seventh aspects.

In accordance with the eleventh aspect of the present invention, the use of the estimated interconnect delay values calculated with high accuracy during the calculation of the path delay value enhances the estimation accuracy of the path delay value.

It is therefore a primary object of the present invention to provide a new circuit model more appropriate for an actual interconnect wire between macro cells than that of conventional circuit models to provide an apparatus which is capable of increasing the calculation accuracy of estimated interconnect delay values relative to actual interconnect delay values by using the new circuit model.

It is another object of the present invention to provide an apparatus which is capable of calculating estimated interconnect delay values with the same accuracy at higher speeds while employing the same new circuit model.

It is still another object of the present invention to improve the new circuit model from the standpoint of the achievement of higher accuracy to provide a higher-accuracy estimated interconnect delay value calculation apparatus.

It is a further object of the present invention to provide an apparatus which is capable of calculating estimated interconnect delay values with higher accuracy at higher speeds while employing the improved new circuit model.

It is a still further object of the present invention to make free use of data determined by statistical technique for electrical calculation using the new circuit model and improved new circuit model to positively make use of past design data.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 illustrates a semiconductor integrated circuit to which a path delay verification apparatus is applied according to a fifth preferred embodiment of the present invention;

FIG. 15 illustrates the concept of a common portion in a circuit model for use in the present invention;

DESCRIPTION OF THE PREFERRED EMBODIMENTS

Figure 19:
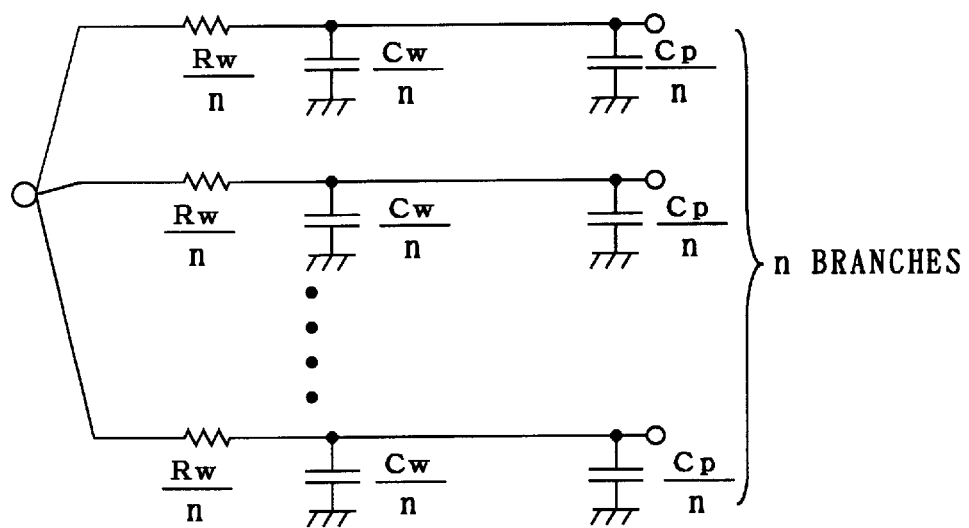
FIG. 19 illustrates a circuit model of Background Art 2.
Figure 20:
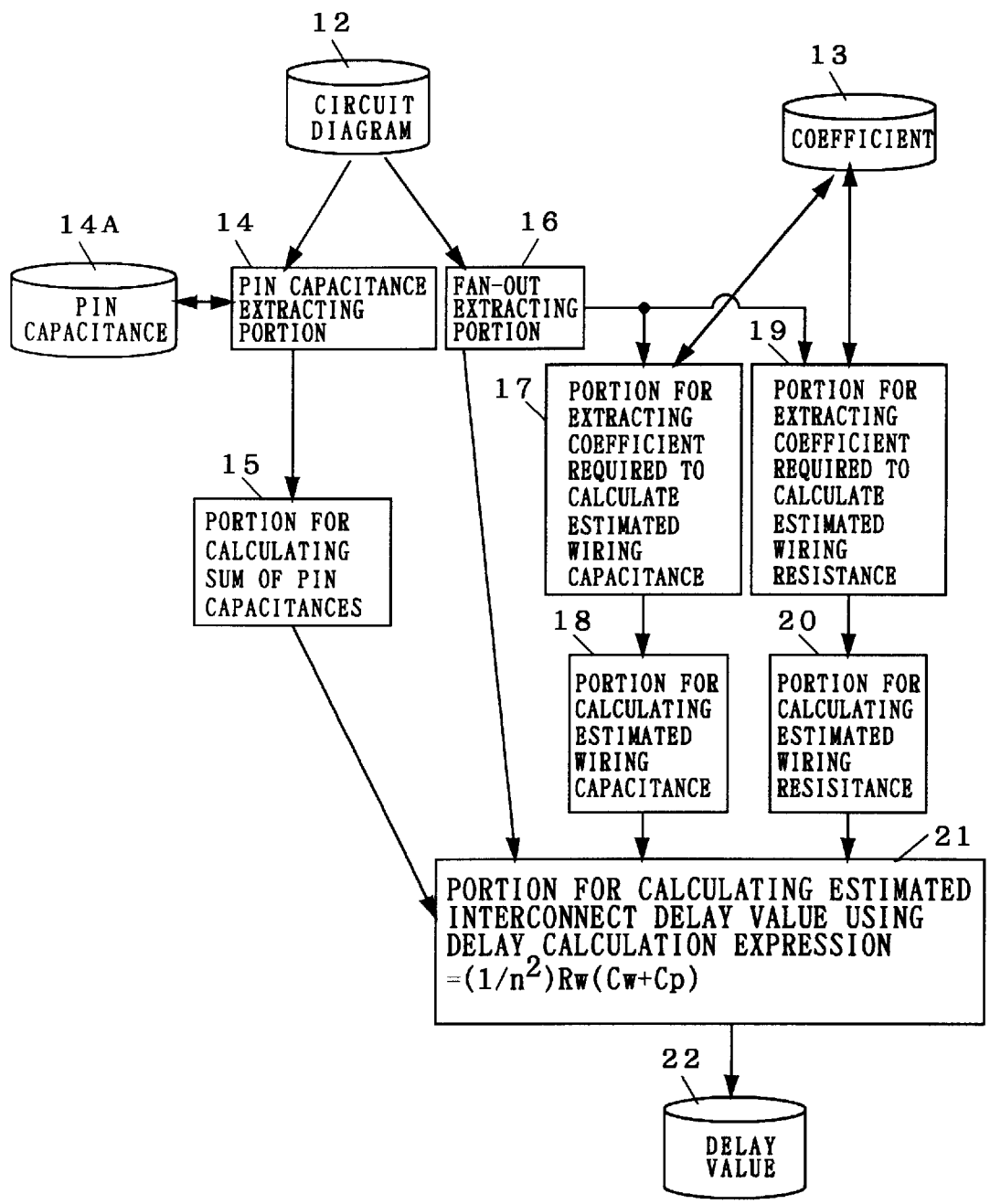
FIG. 20 is a block diagram of a delay calculation apparatus using the circuit model shown in FIG. 19 for calculating the estimated interconnect delay.
Figure 21:
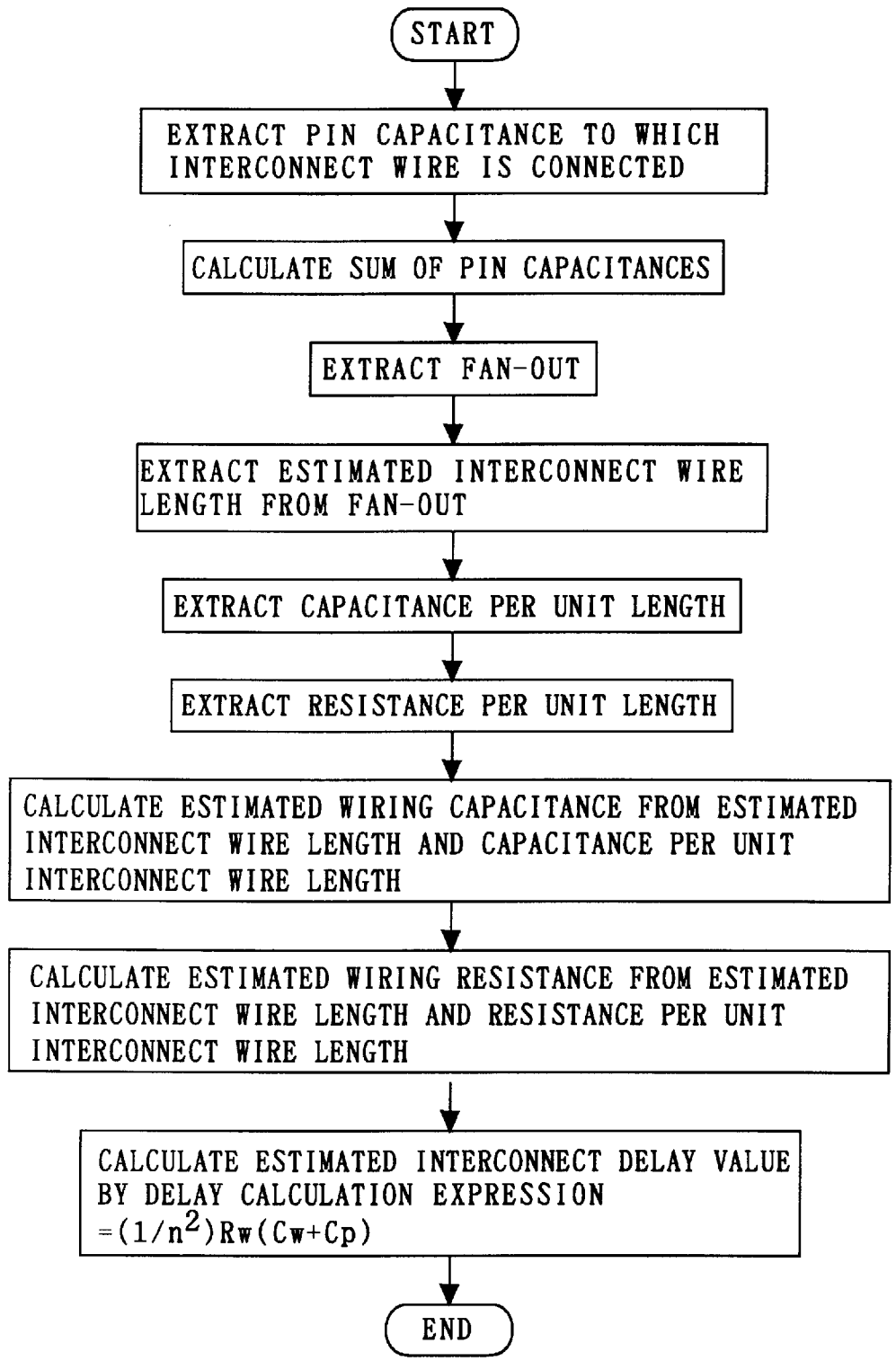
FIG. 21 illustrates the procedure of calculation of the estimated interconnect delay value by using the circuit model shown in FIG. 19.

The circuit model illustrated in FIG. 19 presents a problem in that the interconnect wire between macro cells starts at a branch point. This is considered to cause the calculated interconnect delay time to be constantly shorter than the actual interconnect delay time.

Figure 16:
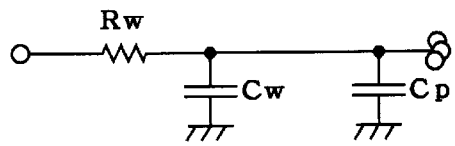
FIG. 16 illustrates a circuit model of Background Art 1.
Figure 17:
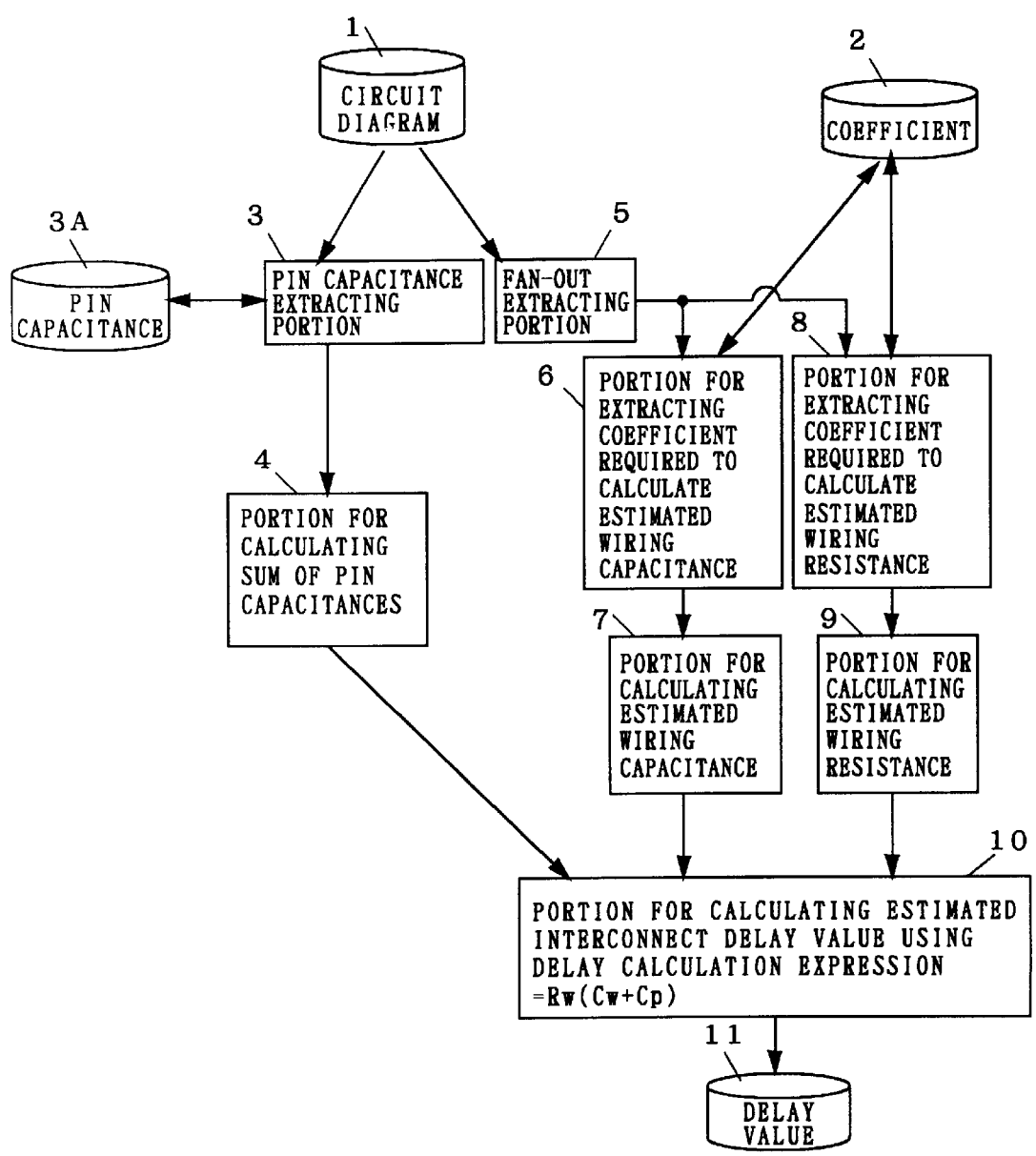
FIG. 17 is a block diagram of a delay calculation apparatus using the circuit model shown in FIG. 16 for calculating an estimated interconnect delay.
Figure 18:
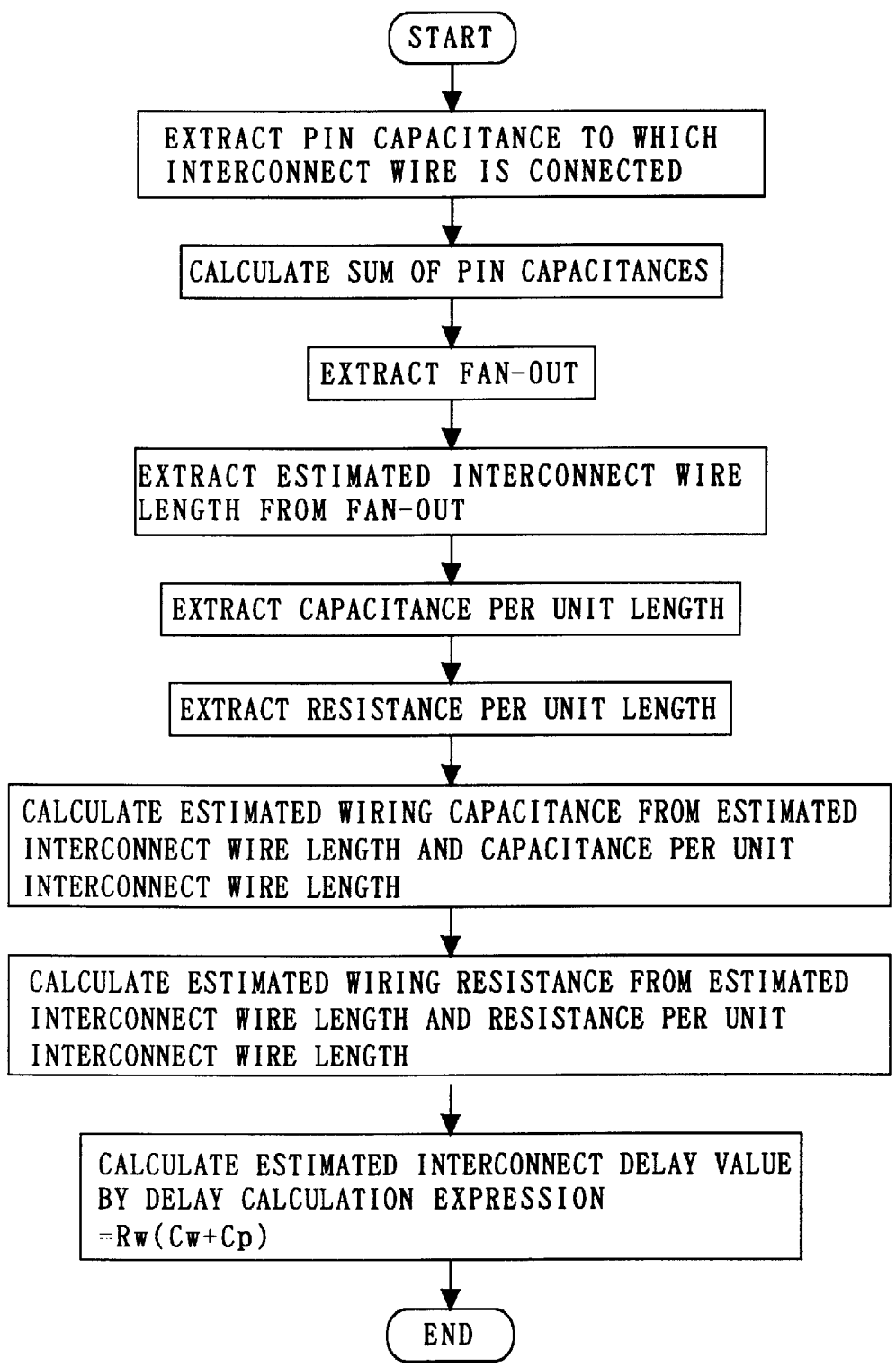
FIG. 18 illustrates the procedure of calculation of the estimated interconnect delay value by using the circuit model shown in FIG. 16.

On the other hand, the circuit model illustrated in FIG. 16 presents a fundamental problem in that a branch point to macro cells to which an interconnect wire is connected is ignored. The circuit model of FIG. 16 provide a margin of the calculated delay value, but the technical principle of providing such design margin will not meet the requirement for the increase in operating rate of a circuit (accordingly the size reduction of the interconnect wires) as above described. Thus, the design principle of the circuit model of FIG. 16 fails in the design of a semiconductor integrated circuit which operates at high speeds. It is hence necessary to fundamentally abandon such design principle.

An interconnect delay calculation apparatus according to the present invention calculates an estimated interconnect delay value based on a new circuit model consisting essentially of (1) a common portion, and (2) a branch portion with a fanout of n ($n \geq 1$) for each interconnect wire path of an interconnect wire between macro cells. The interconnect delay calculation apparatus calculates the estimated interconnect delay value from data of a coefficient A indicative of the ratio of the common portion to the branch portion of the interconnect wire and determined for each fan-out or common to all fan-outs by a user by means of a statistical technique. The calculation of the estimated interconnect delay value by the interconnect delay calculation apparatus uses an estimated wiring resistance and an estimated wiring capacitance indicative, respectively, of a parasitic resistance and a parasitic capacitance of the common portion and branch portion in the circuit model, and data of a pin capacitance for each branch.

The apparatus according to preferred embodiments of the present invention will now be described with reference to the drawings.

(First Preferred Embodiment)

Figure 1:
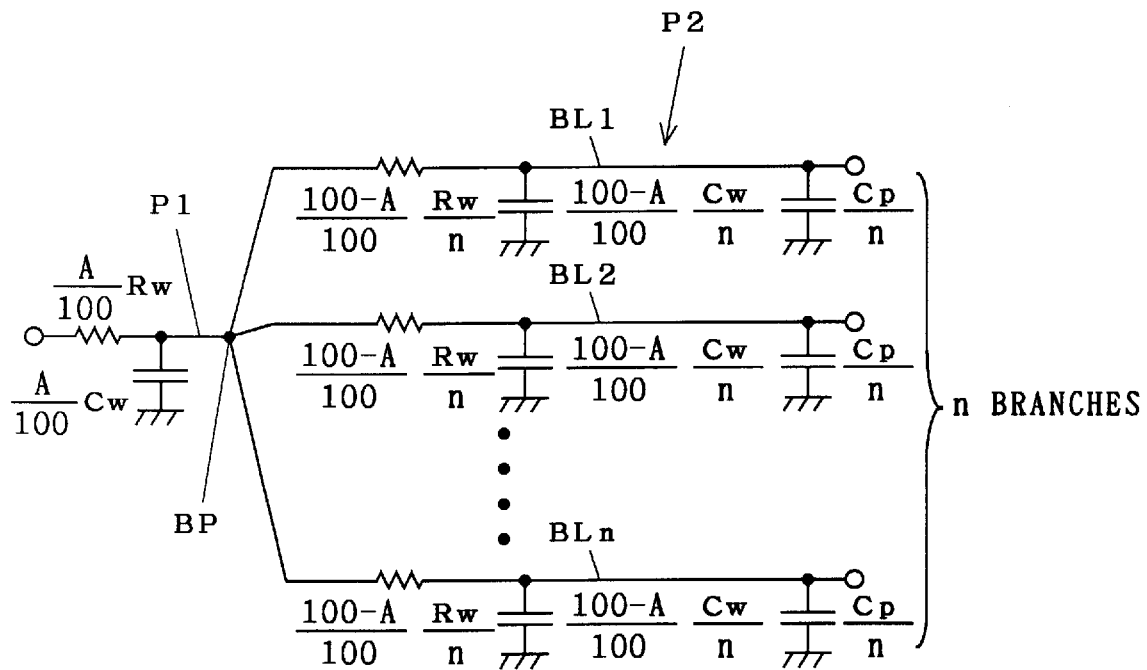
FIG. 1 illustrates a new circuit model applied to first and second preferred embodiments of the present invention.

FIG. 1 illustrates a new circuit model which we propose. The circuit model of FIG. 1 is assumed to include the common portion P1 and the branch portion P2 so that the interconnect wire length of the common portion P1 is A % of the total interconnect wire length between the macro cells and the interconnect wire length of the branch portion P2 is (100−A) %. In the circuit model, it is assumed that the branch portion P2 is uniformly branched for the fan-out n for ease of design and evaluation of the designed circuit. The "fan-out" means the number of destinations n ($n \geq 1$) of a signal to be transmitted as viewed from an output of a certain macro cell (first macro cell) to inputs of the next macro cells (second macro cells).

The common portion P1 is a concept determined as a statistical average value as shown in FIG. 15, and is not the interconnect wire length to a first branch point.

As illustrated in FIG. 1, the common portion P1 includes a first resistance (A/100) Rw as a parasitic resistance connected between an output IN1 (FIG. 15) of the first macro cell and a branch point BP, and a first capacitance (A/100) Cw as a parasitic capacitance connected between the branch point BP and ground.

Each of n branch lines BL1, BL2, . . . , BLn ($n \geq 1$) constituting the branch portion P2 includes a second resistance ((100−A)/100) (Rw/n) as a parasitic resistance connected between the branch point BP and an input pin or input IN2 (FIG. 15) of a corresponding one of the second macro cells to which each branch line is connected, and a second capacitance ((100−A)/100) (Cw/n) as a parasitic capacitance connected between the input pin IN2 and ground. A pin capacitance (Cp/n) of the second macro cell is connected to the input pin IN2 of each branch line BLi ($1 \leq i \leq n$).

In FIG. 1, the reference character Rw designates a total estimated resistance of the interconnect wire; Cw designates a total estimated capacitance of the interconnect wire; and Cp designates the sum of the pin capacitances of the macro cells to which the interconnect wire is connected. In the first preferred embodiment, an average value (Cp/n) of the sum Cp of the pin capacitances is used as the pin capacitance of each of the macro cells (second macro cells) to which the interconnect wire is connected.

The estimated interconnect delay value for the circuit model of FIG. 1 is given by the calculation based on the delay calculation expression=$\{A/100+(100-A)/(100n^2)\}$Rw (Cw+Cp). The calculation expression is derived in a manner to be described below.

Expressing the interconnect delay value using the product (time constant) of resistance and capacitance, $$Delay(A/100) \cdot Rw \cdot \{(A/100) \cdot Cw + n \cdot ((100-A)/100) \cdot Cw/n + Cp\} + ((100-A)/100) \cdot Rw/n \cdot \{(100-A)/100) \cdot Cw/n + Cp/n\} - (A/100) \cdot Rw \cdot (Cw+Cp) + ((100-A)/100) \cdot Rw \cdot \{(100-A)/100 \cdot Cw + Cp)/(n \cdot n) \{(A/100) + ((100-A)/100) \cdot ((100-A)/100)\} \cdot Rw \cdot Cw + \{(A/100) + ((100-A)/100)/(n \cdot n))\} \cdot Rw \cdot Cp \qquad (1)$$

When substitutions $j=(A/100)$ and $k=((100-A)/100)$ are made, Expression (1) is as follows:

$$Delay - \{j + (k \cdot k)/(n \cdot n)\} \cdot Rw \cdot Cw + \{j + k/(n \cdot n)\} \cdot Rw \cdot Cp \qquad (2)$$

In the ranges $n \geq 1$, $0 \leq (A/100) \leq 1$, $0 \leq (100-A/100) \leq 1$, approximation $$j + (k/n)^2 \approx j + k/n^2 \qquad (3)$$

may be made. Thus, approximation $$(A/100) + ((100-A)/100) \cdot ((100-A)/100) \approx (A/100) + ((100-A)/100)/(n \cdot n)) \qquad (4)$$

may be made. Thus, the delay calculation expression may be represented by the above described relation.

The user previously finds the coefficient A for each fan-out n from past design data by using statistical technique. If no design data are found for a given fan-out n, the user executes a linear interpolation using the previously determined coefficients for adjacent fan-outs to find the coefficient A for the given fan-out n. The user files the data of the determined coefficients A for respective fan-outs n.

The apparatus according to the present invention selects the coefficient A corresponding to the fan-out n of the interconnect wire to be designed and uses the above described calculation expression, that is, the delay calculation expression=$\{A/100 + (100-A)/(100n^2)\}Rw(Cw+Cp)$ to calculate the estimated interconnect delay value Tline.

Description will be given in detail on a method of electrically calculating the estimated interconnect delay value on the basis of the new circuit model for the interconnect wire shown in FIG. 1.

Figure 2:
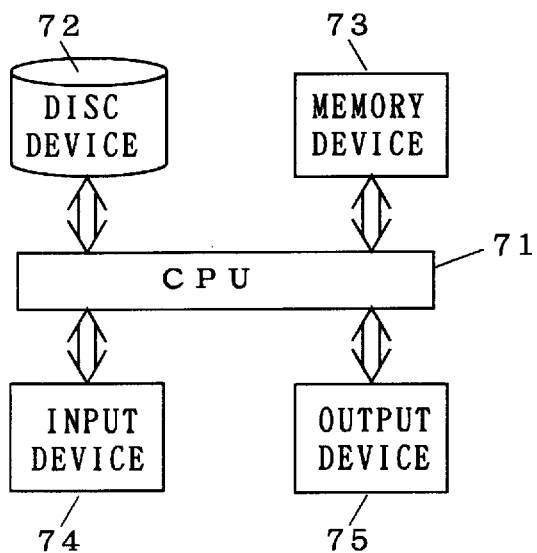
FIG. 2 illustrates the construction of a system to which the present invention is applied.

FIG. 2 is a block diagram of a system for implementing the electrical calculation method based on the new circuit model. The system of FIG. 2 comprises a CPU 71 as a nucleus, a disc device 72 and a memory device 73 both serving as storage devices, an input device 74 such as a keyboard and a mouse, and an output device 75 such as a CRT monitor and a printer. The user uses the input device 74 to input various file data to be described below to the disc device 72 through the CPU 71.

The interconnect delay calculation apparatus according to the present invention is constructed using the system shown in FIG. 2.

Figure 3:
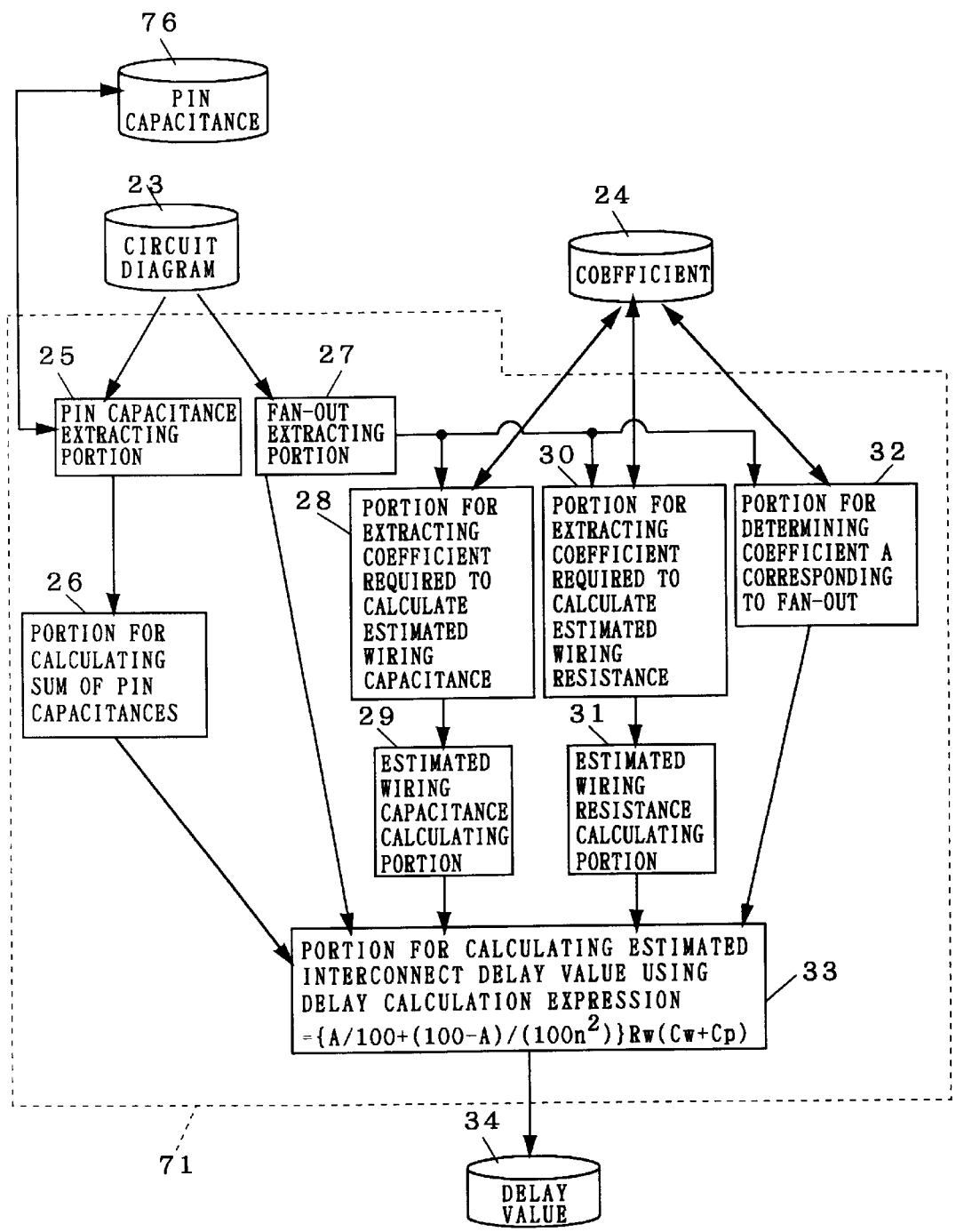
FIG. 3 is a block diagram of a delay calculation apparatus using the circuit model shown in FIG. 1 according to the first preferred embodiment.

FIG. 3 is a functional block diagram of the interconnect delay calculation apparatus for electrically calculating the estimated interconnect delay value on the basis of the circuit model of FIG. 1.

In FIG. 3, the reference numeral 23 designates a circuit diagram file portion for electrically storing therein data signals indicative of circuit diagram information data (for example, the types of second macro cells for use in the interconnect wire, connected pin information, and the fan-out n of the interconnect wire) when the circuit model shown in FIG. 1 is used for the interconnect wire between macro cells in a semiconductor integrated circuit to be designed; 76 designates a pin capacitance file portion for electrically holding data signals about the pin capacitances inherent in a plurality of types of semiconductor devices usable as the second macro cells as a library; and 24 designates a coefficient file portion for electrically storing therein coefficient table data signals required to calculate the interconnect delay value using the circuit model shown in FIG. 1. The various data signals stored in these file portions 23, 24, and 76 are previously inputted thereto by the user using the input device 74 of FIG. 2. The coefficient file portion 24 contains the data about (1) a wiring resistance per unit interconnect wire length (second coefficient table data), (2) a wiring capacitance per unit interconnect wire length (third coefficient table data), (3) an estimated interconnect wire length for each fan-out (fourth coefficient table data), and (4) the coefficient A for each fan-out (first coefficient data), all of which are written therein. The user previously determines the coefficient table data (3) and (4) by means of the statistical technique using the past design data. The coefficient table data (1) and (2) depend upon transistor dimensions and whether an aluminum interconnect wire is comprised of one or two layers, but may be determined as fixed values if a semiconductor manufacturing process and the number of interconnect wires are determined. The estimated interconnect wire length of the coefficient table data (3) is the total length of the interconnect wire comprised of the common portion and the whole branch portion in the model of FIG. 1.

The coefficient table data (3) in the coefficient file portion may be a coefficient ($\alpha(n)$) of the linear equation ($y = \alpha x + \beta$) by which the estimated interconnect wire length is calculated for each fan-out n in place of the individually set estimated interconnect wire length for each fan-out.

The reference numeral 27 designates a portion for extracting the data of the fan-out n from the circuit diagram file portion 23; 25 designates a portion for extracting the data of the second macro cell type information and pin information from the circuit diagram file portion 23 to extract the pin capacitance of each macro cell to which the corresponding interconnect wire is connected from the pin capacitance file portion 76 on the basis of the extracted data; 26 designates a portion for electrically calculating the sum Cp of the pin capacitances of the respective macro cells extracted by the pin capacitance extracting portion 25; 28 designates a portion for extracting the coefficient table data (2) and (3) required to calculate the estimated wiring capacitance from the coefficient file portion 24 on the basis of the data of the fan-out n; 29 designates a portion for electrically calculating the estimated wiring capacitance Cw on the basis of the coefficient table data (2) and (3) extracted by the extracting portion 28; 30 designates a portion for extracting the coefficient table data (1) and (3) required to calculate the estimated wiring resistance from the coefficient file portion 24 on the basis of the data of the fan-out n; 31 designates a portion for electrically calculating the estimated wiring resistance on the basis of the coefficient table data (1) and (3) extracted by the extracting portion 30; and 32 designates a portion for determining the coefficient A for the fan-out n on the basis of the coefficient table data (4) extracted from the portion 24. The percentage determining portion 32 basically selects the coefficient A for the fan-out n from the coefficient file portion 24 to determine the coefficient A. If the coefficient A corresponding to the given fan-out n is not stored in the coefficient file portion 24, the percentage determining portion 32 extracts the coefficient table data A(n−a) and A(n+b) corresponding to adjacent fan-outs to determine the data of the coefficient A corresponding to the fan-out n by the linear interpolation using the coefficient table data A(n− a) and A(n+b). For example, assuming that A(3)=20% when the fan-out n equals 3 and A(5)=16% when the fan-out n equals 5, the coefficient data A(4) corresponding to the fan-out which is equal to 4 and not stored in the coefficient file portion 24 are determined as 18% by the linear interpolation.

The reference numeral 33 designates a portion for electrically calculating the estimated interconnect delay value Tline using the data of the sum Cp of pin capacitances, the estimated wiring capacitance Cw, the estimated wiring resistance Rw, the coefficient A, and the fan-out n which are determined by the respective portions 26, 29, 31, and 32 on the basis of the above described calculation expression, that is, the delay calculation expression=$\{A/100+(100-A)/(100n^2)\}Rw(Cw+Cp)$.

The reference numeral 34 designates an output file portion for storing therein the data signal of the estimated interconnect delay value determined by the portion 33. A memory (for example, the memory device 73 of FIG. 2) may be used in place of the output file portion 34 to store the data signal of the estimated interconnect delay value therein.

Figure 4:
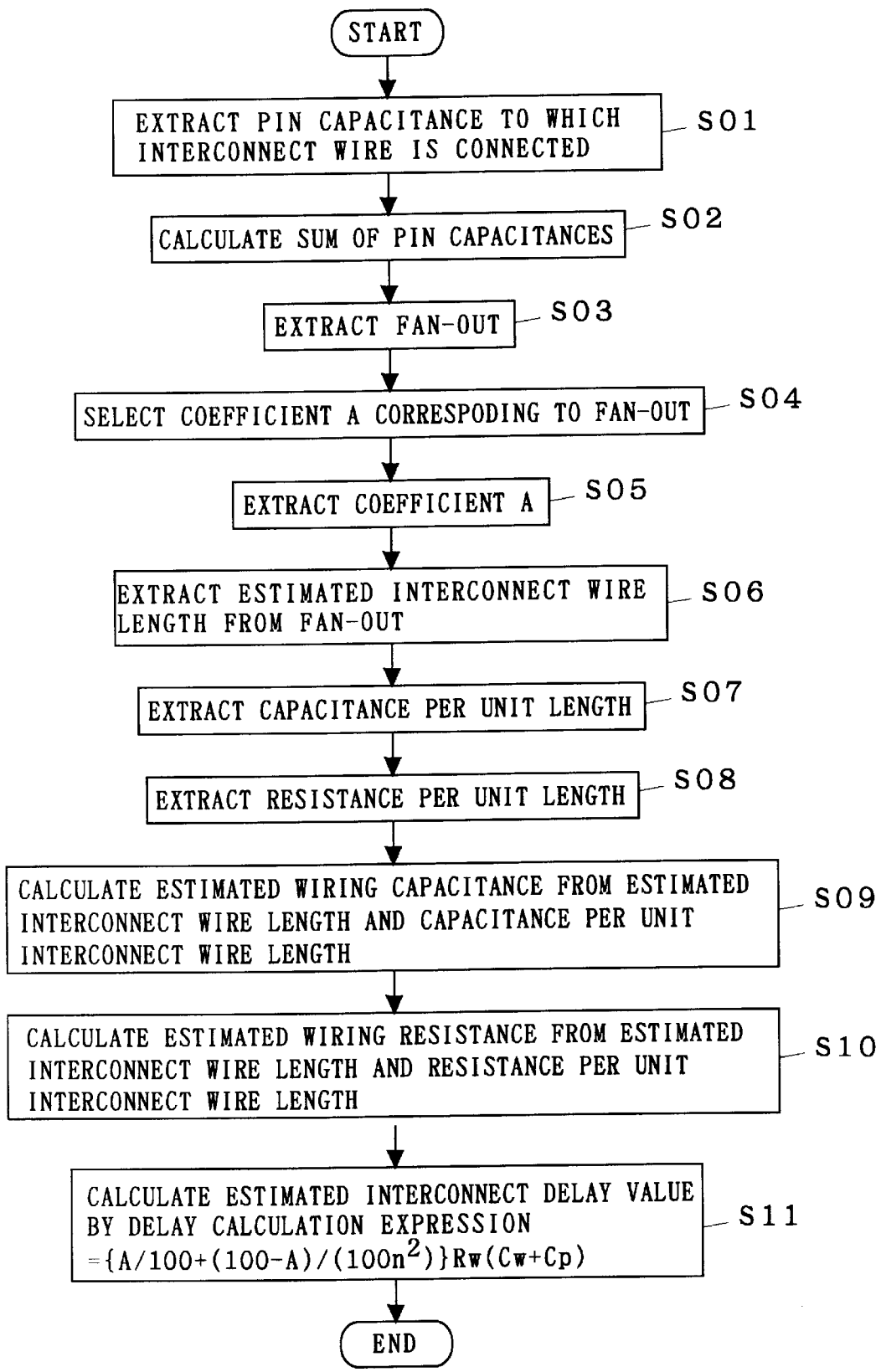
FIG. 4 illustrates the procedure of calculation of an estimated interconnect delay value from a coefficient A for each fan-out by using the circuit model shown in FIG. 1.

FIG. 4 is a flow chart illustrating the operation of the interconnect delay calculation apparatus shown in FIG. 3. FIG. 4 illustrates the procedure of calculation of the estimated delay value of each interconnect wire when the estimated interconnect wire length data are set for each fan-out n in the coefficient file portion 24 depicted in FIG. 3.

In this procedure, the portion 25 initially extracts the circuit diagram information data (the pin information, the second macro cell type information, and the like) from the circuit diagram file portion 23 to extract the pin capacitances of the corresponding macro cells to which the interconnect wire is connected one by one from the pin capacitance file portion 76 on the basis of the extracted data. Then, the portion 26 electrically adds together the data of the respective pin capacitances extracted by the portion 25 to calculate the sum Cp of the pin capacitances.

The portion 27 extracts the data of the fan-out n from the circuit diagram file portion 23.

The portion 32 accesses the coefficient file portion 24 to select the table data of the coefficient A in the file of the coefficient file portion 24 on the basis of the data of the fan-out n extracted by the portion 27 to extract the selected table data of the coefficient A as the data of the coefficient A (first coefficient data). If the corresponding table data of the coefficient A are not found in the file, the portion 32 determines the data of the coefficient A by the linear interpolation as above described.

The portion 28 extracts the corresponding coefficient table data (3) of the estimated interconnect wire length as fourth coefficient data from the file of the coefficient file portion 24 on the basis of the data of the fan-out n extracted by the portion 27. Further, the portion 28 extracts the coefficient table data (2) of the capacitance per unit interconnect wire length as third coefficient data from the file of the coefficient file portion 24. The portion 30 extracts the coefficient table data (1) of the resistance per unit interconnect wire length as second coefficient data from the coefficient file portion 24. Since the coefficient table data (3) of the estimated interconnect wire length required to calculate the estimated wiring resistance Rw have already been extracted as the fourth coefficient data in the previous step by the portion 28 and stored in a register not shown in the CPU 71, the portion 30 may access the register to use the coefficient data (3).

The portion 29 electrically multiplies the data (3) of the estimated interconnect wire length by the data (2) of the capacitance per unit interconnect wire length to calculate the estimated wiring capacitance Cw. Then, the portion 31 electrically multiplies the data (3) of the estimated interconnect wire length by the data (1) of the resistance per unit interconnect wire length to calculate the estimated wiring resistance Rw.

The portion 33 calculates the estimated delay value of each interconnect wire using the respective data of the sum of the pin capacitances, the estimated wiring capacitance, the estimated wiring resistance, the fan-out, and the coefficient A on the basis of the delay calculation expression=$\{A/100+(100-A)/(100n^2)\}Rw(Cw+Cp)$ to output the calculated data to the output file portion 34. Since the delay calculation value for each branch BLi ($1 \leq i \leq n$) equals the value calculated by the above described delay calculation expression (because the pin capacitances are assumed to be equal), the value calculated once may be used as the estimated interconnect delay values of each interconnect wire. This is advantageous in terms of calculation speeds as compared with third and fourth preferred embodiments to be described later.

The above described construction may calculate the estimated interconnect delay value with much higher accuracy than the construction using the background art circuit models and solve the background art problem of re-design after design is completed.

Figure 5:
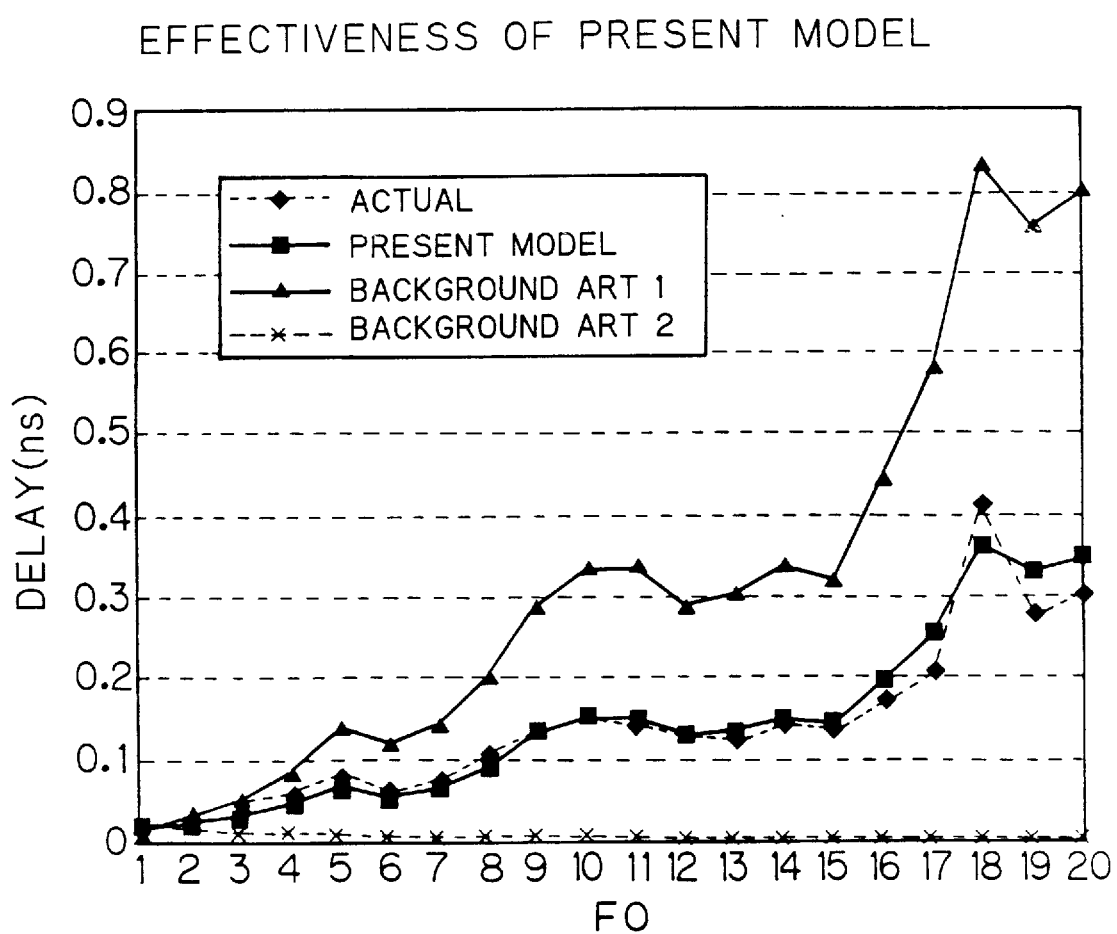
FIG. 5 illustrates the effectiveness of the calculation of the interconnect delay value according to the present invention.

In FIG. 5 are shown the estimated interconnect delay values provided using the delay calculation device of the first preferred embodiment and the interconnect delay values of the actually fabricated circuit, with the results provided using the circuit model of Background Art 1 (Worst-Case RC Tree) and the circuit model of Background Art 2 (Balanced-Case RC Tree). The fan-out n is plotted as the abscissa (FO) in FIG. 5.

It will be appreciated from FIG. 5 that the estimated interconnect delay values provided in the first preferred embodiment substantially match the interconnect delay values of the actual circuit over the wide range of the fan-out.

The above results of comparison pronouncedly prove the effectiveness of the present invention.

(Second Preferred Embodiment)

The circuit model and the delay calculation expression thereof for use in a second preferred embodiment are similar to those described in the first preferred embodiment. In the second preferred embodiment, however, the user previously determines the coefficient A common to any fan-out by using the statistical technique from the past design data. This is based on the fact that a sufficiently good result is obtained if the coefficient A is fixed because of small difference between the coefficients A for respective fan-outs as a result of repeated experiments.

Figure 6:
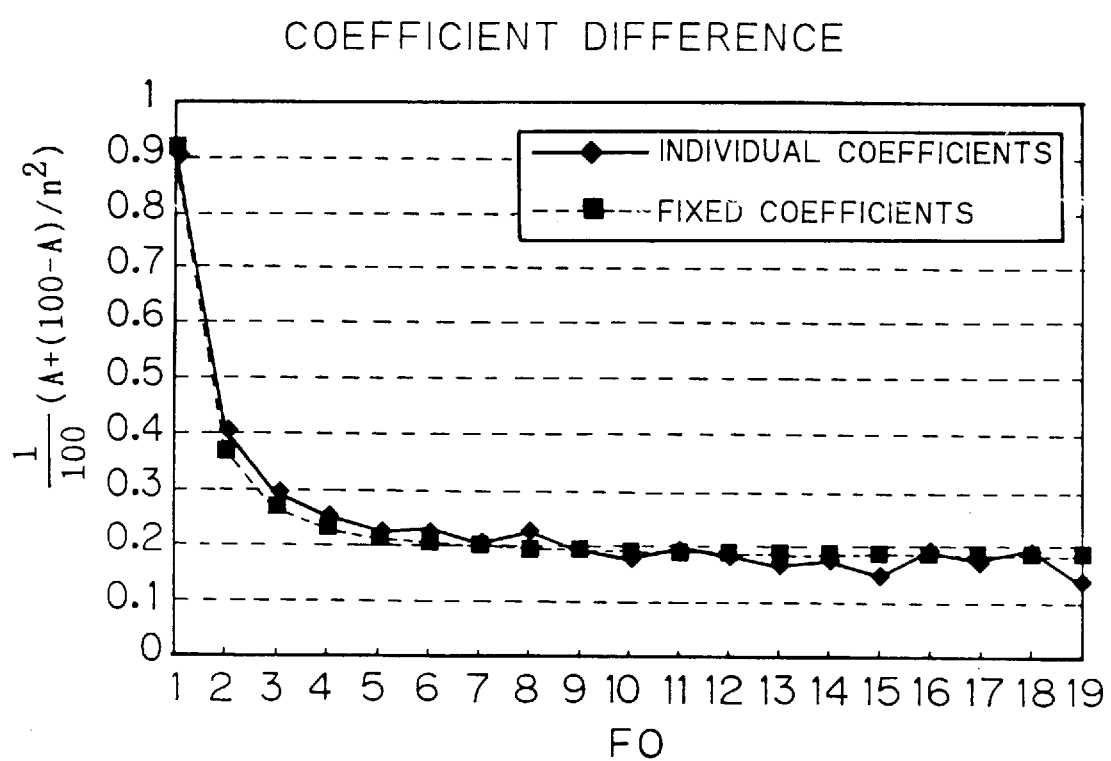
FIG. 6 illustrates the foundation of the technical principle of the second preferred embodiment.

An example of the experimental results is shown in FIG. 6. The abscissa of FIG. 6 is the fan-out n, and the ordinate thereof is a portion dependent upon the coefficient A in the delay calculation expression. It will be appreciated from FIG. 6 that there is little difference between the results for individual coefficients A for each fan-out and the results for fixed coefficients A. Thus, FIG. 6 means that the coefficient A is not dependent upon the fan-out but may be used as constant.

The coefficient A is selected for each fan-out to calculate the estimated interconnect delay value in the first preferred embodiment. The interconnect delay calculation apparatus in the second preferred embodiment, on the other hand, uses the data of the common coefficient A for all fan-outs to calculate the estimated interconnect delay value on the basis of the above described delay calculation expression=$\{A/$ $100+(100-A)/(100n^2)\}Rw(Cw+Cp)$. The details of the calculation will be discussed hereinafter.

Figure 7:
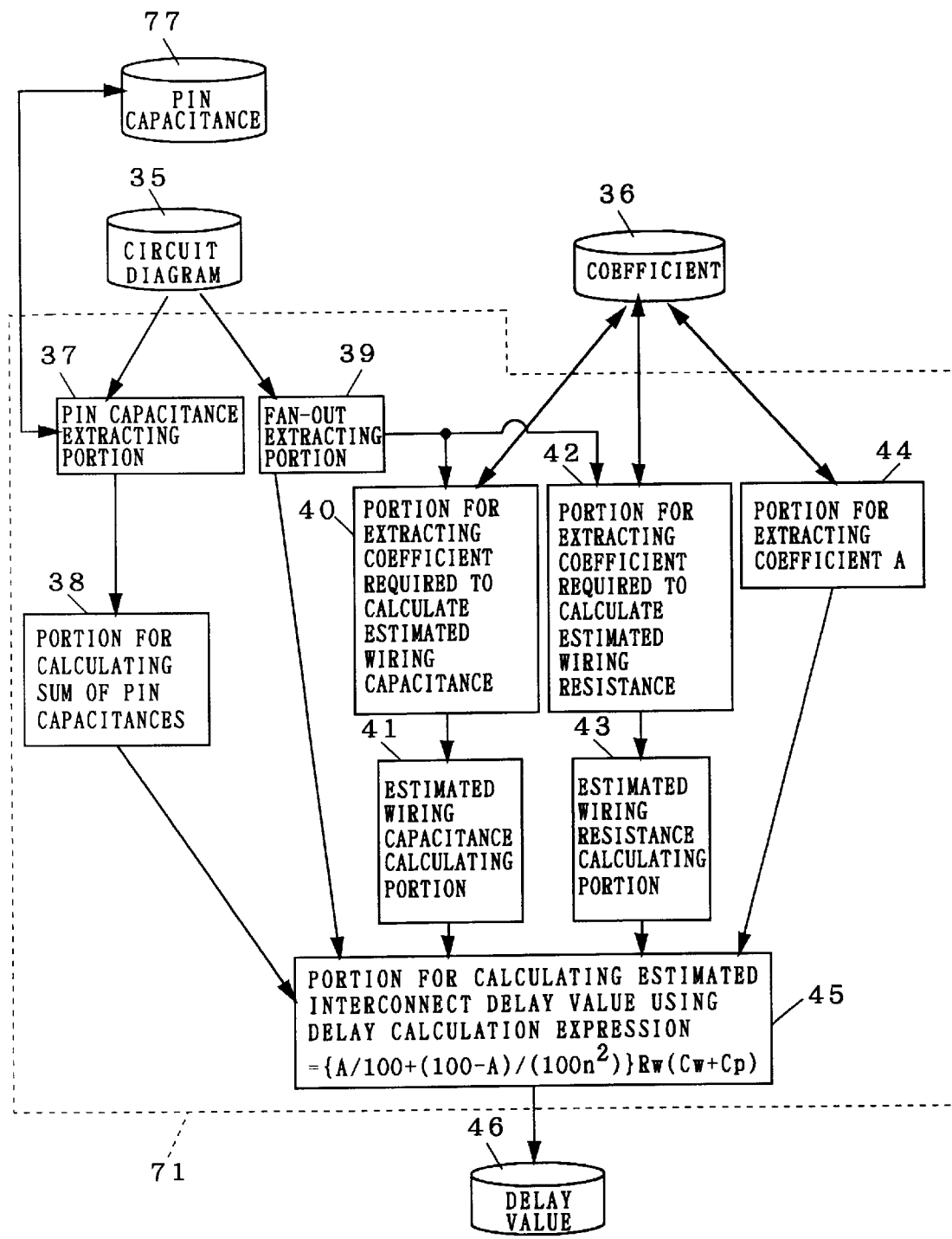
FIG. 7 is a block diagram of the delay calculation apparatus according to the second preferred embodiment.

FIG. 7 is a functional block diagram of the delay calculation apparatus according to the second preferred embodiment for calculating the interconnect delay on the basis of the circuit model of FIG. 1. In FIG. 7, the reference numeral 35 designates a portion corresponding to the circuit diagram file portion 23 of FIG. 3; and 36 designates a coefficient file portion containing coefficient data to be described below as table values. The coefficient file portion 36 contains (1) the wiring resistance per unit interconnect wire length, (2) the wiring capacitance per unit interconnect wire length, (3) the estimated interconnect wire length for each fan-out, and (4) the coefficient A common to any fan-out (first coefficient table data) which are written therein. Thus, only the first coefficient table data (4) differ from the corresponding first coefficient table data in the coefficient file portion 24 of FIG. 1. A coefficient of the linear expression by which the estimated interconnect wire length is calculated may be set in the coefficient file portion 36 in place of the estimated interconnect wire length for each fan-out. The reference numeral 77 designates a portion corresponding to the pin capacitance file portion 76 of FIG. 3; 37 designates a portion corresponding to the extracting portion 25 of FIG. 3; 38 designates a portion corresponding to the portion 26 of FIG. 3; 39 designates a portion corresponding to the extracting portion 27 of FIG. 3; 40 designates a portion corresponding to the extracting portion 28 of FIG. 3; 41 designates a portion corresponding to the estimated wiring capacitance calculating portion 29 of FIG. 3; 42 designates a portion corresponding to the coefficient extracting portion 30 of FIG. 3; and 43 designates a portion corresponding to the estimated wiring resistance calculating portion 31 of FIG. 3.

The reference numeral 44 designates a portion for extracting the table data (4) of the coefficient A common to any fan-out as the first coefficient data from the file of the coefficient file portion 36; 45 designates a portion for calculating the estimated interconnect delay value by using the data of the sum Cp of the pin capacitances, the data of the estimated wiring capacitance Cw, the data of the estimated wiring resistance Rw, the data indicative of the fixed coefficient A, and the data indicative of the fan-out n on the basis of the above described delay calculation expression= $\{A/100+(100-A)/(100n^2)\}Rw(Cw+Cp)$; and 46 designates a portion corresponding to the output file portion 34 of FIG. 3. The memory device 73 of FIG. 1 may be used in place of the output file portion 46.

Figure 8:
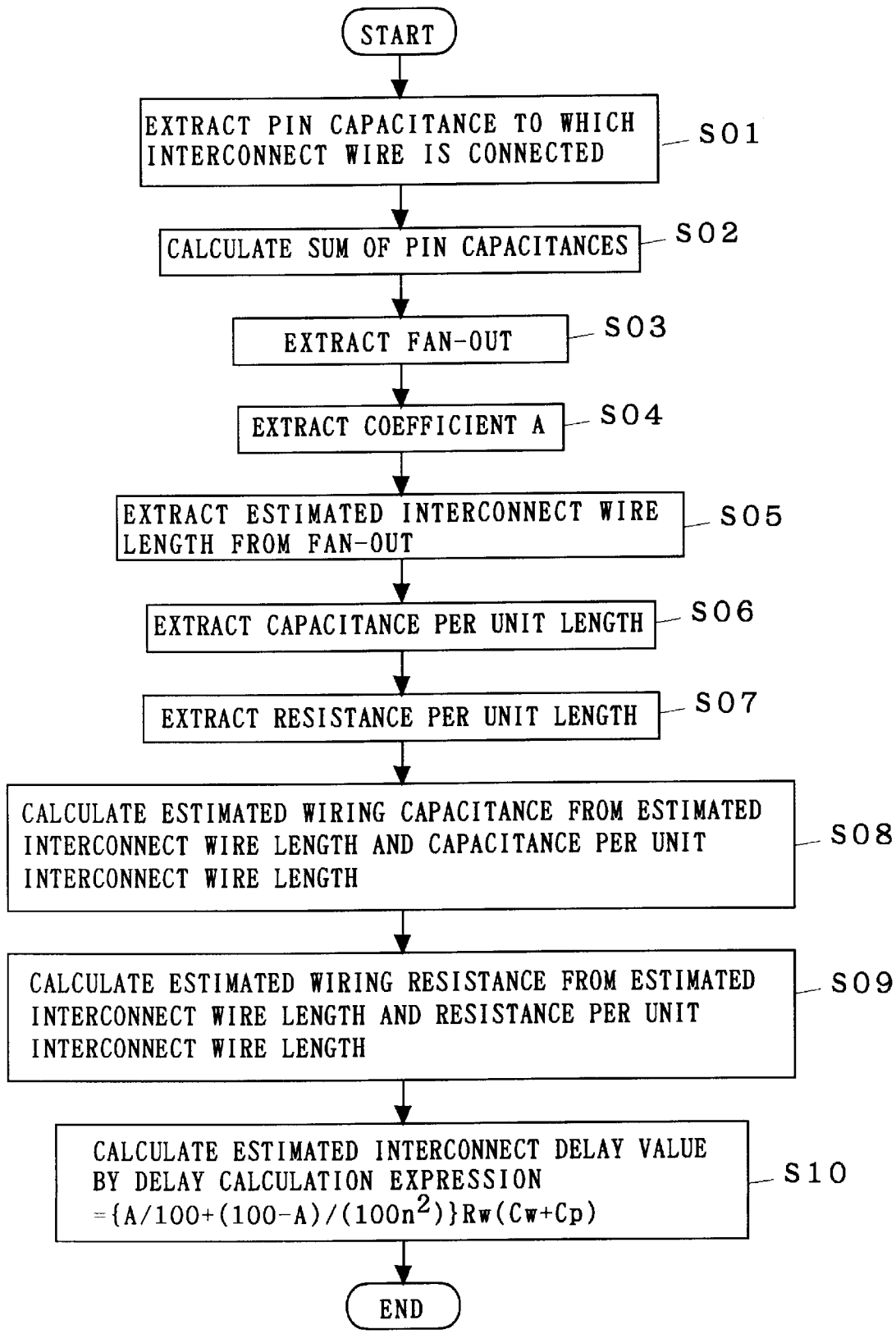
FIG. 8 illustrates the procedure of calculation of the estimated interconnect delay value according to the second preferred embodiment.

FIG. 8 is a flow chart illustrating the operation of the interconnect delay value calculation apparatus shown in FIG. 7. FIG. 8 illustrates the procedure of calculation of the estimated delay value of each interconnect wire when the user previously sets the estimated interconnect wire length for each fan-out in the coefficient file portion 36.

In this procedure, the portion 37 of FIG. 5 initially extracts the pin capacitance Cpi ($1 \leq i \leq n$) of each macro cell (second macro cell) to which the interconnect wire is connected from the file of the pin capacitance file portion 77 on the basis of the data of the second macro cell type, etc. extracted from the circuit diagram file portion 35. Then, the portion 38 electrically performs the operation of addition ($\Sigma Cpi$) of the extracted pin capacitances Cpi to electrically calculate the sum Cp of the pin capacitances. The portion 39 extracts the data of the fan-out n ($n \geq 1$) of the interconnect wire of the designed circuit from the file of the circuit diagram file portion 35. The portion 44 extracts the table data of the common coefficient A as the first coefficient data (A) from the file of the coefficient file portion 36 on the basis of the data of the fan-out n. The portion 40 extracts the coefficient table data (3) of the estimated interconnect wire length as the fourth coefficient data from the file of the coefficient file portion 36 by using the extracted data of the fan-out n and extracts the coefficient table data (2) of the capacitance per unit interconnect wire length as the third coefficient data. The portion 42 extracts the coefficient table data (1) of the resistance per unit interconnect wire length as the second coefficient data from the file of the coefficient file portion 36. The portion 42 uses the coefficient data (3) stored in a register not shown in the CPU 71.

The portion 41 multiplies the data (3) of the extracted estimated interconnect wire length by the data (2) of the capacitance per unit interconnect wire length to electrically calculate the estimated wiring capacitance. The portion 43 multiplies the data (3) of the extracted estimated interconnect wire length by the data (1) of the resistance per unit interconnect wire length to electrically calculate the estimated wiring resistance.

The portion 45 electrically calculates the estimated delay value of each interconnect wire by using the respective data of the sum of the pin capacitances, the estimated wiring capacitance, the estimated wiring resistance, the fan-out, and the coefficient A (constant) on the basis of the delay calculation expression=$\{A/100+(100-A)/(100n^2)\}Rw(Cw+Cp)$.

According to the second preferred embodiment of the present invention, the step of determining the coefficient A is simplified, permitting faster calculation than that of the first preferred embodiment while maintaining the same accuracy as that of the first preferred embodiment (FIG. 6).

(Third Preferred Embodiment)

The third preferred embodiment employs a calculation method of individually determining the pin capacitance Cpi ($1 \leq i \leq n$) for each macro cell (second macro cell) to which the interconnect wire is connected. Such minute determination of the pin capacitances may meet the requirement for higher speed operation.

Figure 9:
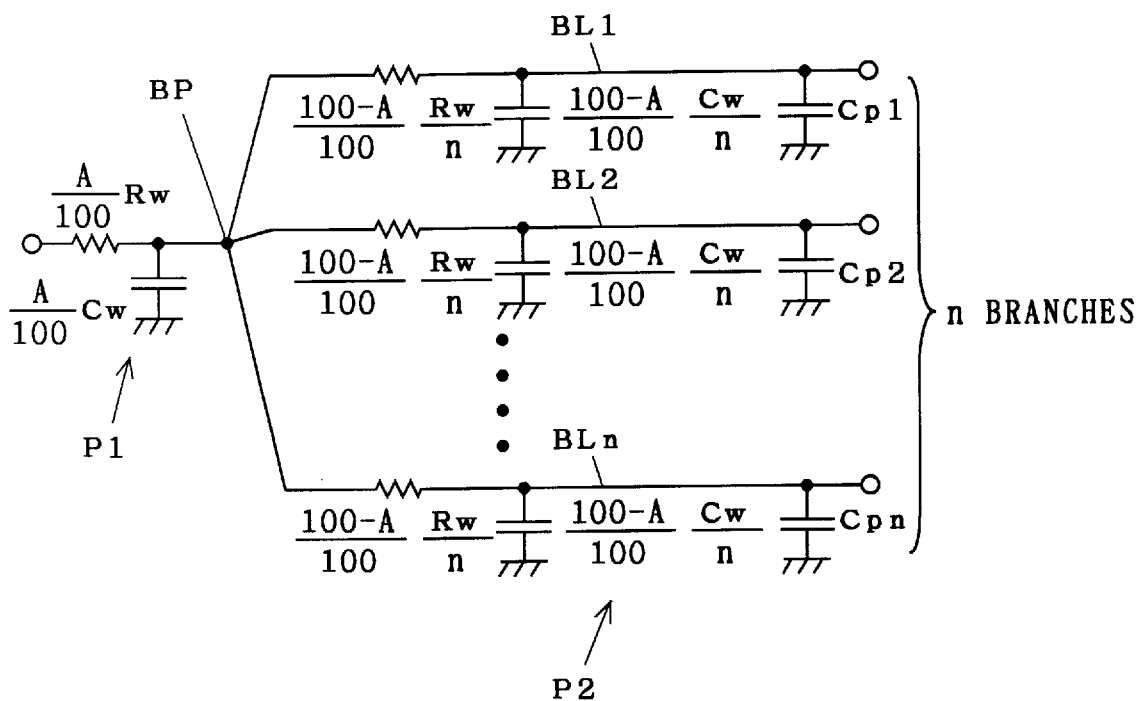
FIG. 9 illustrates a new circuit model for use in third and fourth preferred embodiments of the present invention.

FIG. 9 illustrates another new circuit model different from that of FIG. 1. In the circuit model of FIG. 9, the common portion and the branch portion are assumed. In FIG. 9, the reference character Rw designates the total estimated resistance of this interconnect wire; Cw designates the total estimated capacitance of the interconnect wire; and Cp1, Cp2, . . ., Cpn (Cpi) designate the pin capacitances of the respective macro cells to which the interconnect wire is connected. In the circuit model of FIG. 9, it is assumed that the interconnect wire length of the common portion is A % of the total interconnect wire length and the interconnect wire length of the branch portion is (100−A) % as in the first preferred embodiment. It is also assumed that the branch portion is uniformly branched for the fan-out n as in the first preferred embodiment. In general, the reference character Cpi is denoted as the pin capacitance of an i-th one of the second macro cells to which the interconnect wire is connected.

The estimated interconnect delay value provided using the new circuit model of FIG. 9 may be given by the delay calculation expression=$(A/100)$ Rw $(Cw+Cp)+\{(100-A)/100\}^2$ $(1/n^2)$ Rw·Cw+$\{(100-A)/(100n)\}$Rw·Cpi when the well known Elmore delay model is employed.

The user previously determines the coefficient A for each fan-out by using the statistical technique from the past design data to input the data to various file portions (storage portions) to be described later as a library or table values. The apparatus of the third preferred embodiment selects the data of the coefficient A corresponding to the given fan-out n from the storage portions to determine the coefficient A. If no data of the coefficient A is found for the given fan-out n, the apparatus of the third preferred embodiment determines the data of the coefficient A corresponding to the given fan-out n by the linear interpolation from adjacent determined coefficients. The apparatus electrically calculates the estimated interconnect delay value using the delay calculation expression=$(A/100)$ Rw $(Cw+Cp)+\{(100-A)/100\}^2$ $(1/n^2)$ Rw·Cw+$\{(100-A)/(100n)\}$Rw·Cpi. The details of the calculation will be described hereinafter.

Figure 10:
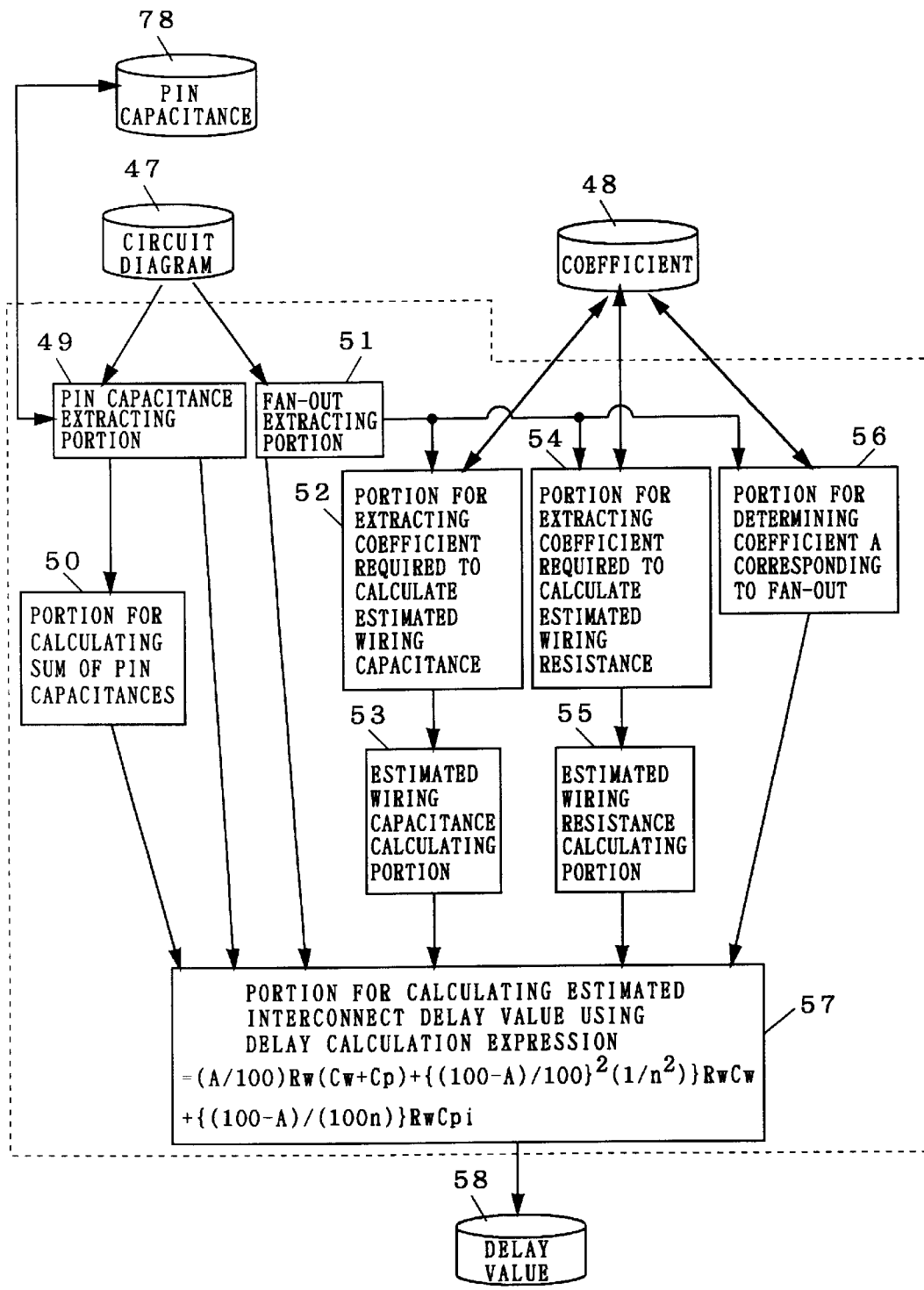
FIG. 10 is a block diagram of the delay calculation apparatus according to the third preferred embodiment.

FIG. 10 is a functional block diagram of the delay calculation apparatus for calculating the interconnect delay in the circuit model of FIG. 9. In FIG. 10, the reference numeral 47 designates a portion corresponding to the circuit diagram file portion 23 of FIG. 3; and 48 designates a coefficient file portion for holding various coefficient table data required to calculate the interconnect delay value in the circuit model of FIG. 9. The files of the coefficient file portion 48 contain (1) the wiring resistance per unit interconnect wire length, (2) the wiring capacitance per unit interconnect wire length, (3) the estimated interconnect wire length for each fan-out, and (4) the coefficient A for each fan-out, all of which are written in the form of table values. A coefficient of the linear expression by which the estimated interconnect wire length is calculated may be set in the file of the coefficient file portion 48 in place of the estimated interconnect wire length for each fan-out.

The reference numeral 78 designates a file portion corresponding to the portion 76 of FIG. 3 for constituting the library of pin capacitances; 49 designates a portion for extracting the pin capacitance Cpi of each macro cell to which the interconnect wire is connected; 50 designates a portion for calculating the sum Cp of the pin capacitances Cpi extracted by the portion 49; 51 designates a portion corresponding to the portion 27 of FIG. 3; 52 designates a portion corresponding to the extracting portion 28 of FIG. 3; 53 designates a portion corresponding to the estimated wiring capacitance calculating portion 29 of FIG. 3; 54 designates a portion corresponding to the extracting portion 30 of FIG. 3; 55 designates a portion corresponding to the estimated wiring resistance calculating portion 31 of FIG. 3; and 56 designates a portion corresponding to the portion 32 of FIG. 3. The portion 56 selects the data of the coefficient A corresponding to the fan-out n to determine the coefficient A. If no corresponding data of the coefficient A are found in the coefficient file, the portion 56 determines the data of the coefficient A corresponding to the given fan-out n by the linear interpolation using the coefficient data corresponding to adjacent fan-outs.

The reference numeral 57 designates a portion for electrically calculating the estimated interconnect delay value using the pin capacitance Cpi of an i-th one of the second macro cells to which the interconnect wire is connected, the sum Cp of the pin capacitances, the estimated wiring capacitance Cw, the estimated wiring resistance Rw, the coefficient A, and the fan-out n on the basis of the delay calculation expression=$(A/100)$ Rw $(Cw+Cp)+\{(100-A)/100\}^2$ $(1/n^2)$ Rw·Cw+$\{(100-A)/(100n)\}$Rw·Cpi; 58 designates an output file portion for storing therein the data of the estimated interconnect delay value determined by the calculating portion 57. A memory may be used in place of the portion 58 to store the data of the estimated interconnect delay value therein.

Figure 11:
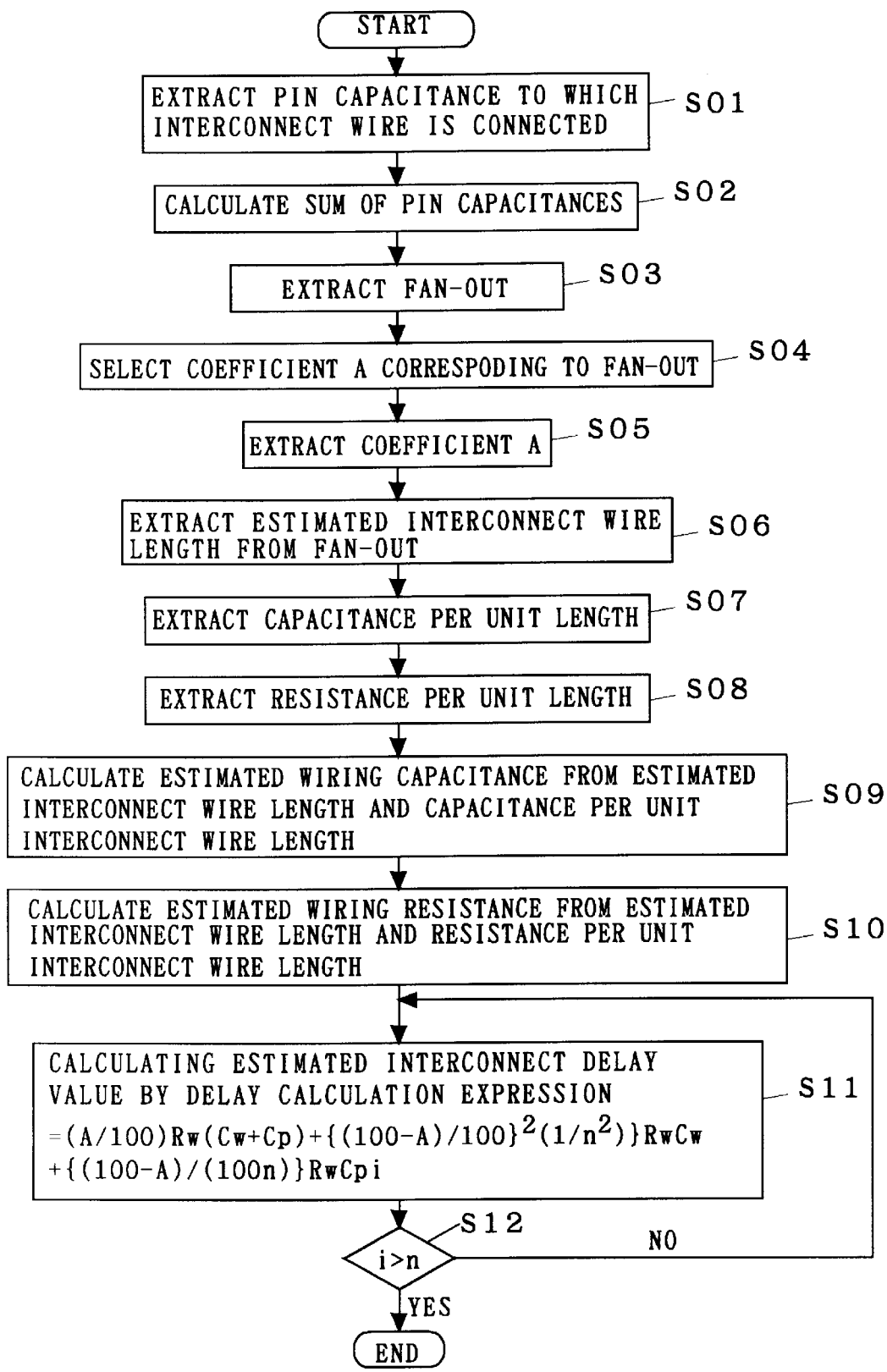
FIG. 11 illustrates the procedure of calculation of the estimated interconnect delay value according to the third preferred embodiment.

FIG. 11 is a flow chart illustrating the operation of the interconnect delay calculation apparatus of FIG. 10. FIG. 11 illustrates the procedure of calculation of the estimated delay value for each interconnect wire when the data of the estimated interconnect wire length are set for each fan-out n in the coefficient file portion 48.

In this procedure, the portion 49 initially extracts the data indicative of the information of the types of macro cells to which the interconnect wire is connected from the file of the circuit diagram file portion 47 to extract the data of the pin capacitance Cpi of each macro cell to which the interconnect wire is connected from the pin capacitance file portion 78 on the basis of the extracted data. The portion 50 adds together the extracted pin capacitances Cpi to electrically calculate the sum Cp of the pin capacitances.

The portion 51 extracts the data indicative of the fan-out n from the circuit diagram file portion 47. The portion 56 selects the table data of the corresponding coefficient A from the file of the coefficient file portion 48 on the basis of the extracted fan-out n to extract the table data of the selected coefficient A as the data of the coefficient A. The portion 52 extracts the data of the estimated interconnect wire length from the coefficient file portion 48 on the basis of the data of the extracted fan-out n. The portion 52 also extracts the data of the capacitance per unit interconnect wire length. The portion 54 similarly extracts the data of the resistance per unit interconnect wire length.

The portion 53 multiplies the data of the estimated interconnect wire length by the data of the capacitance per unit interconnect wire length to calculate the estimated wiring capacitance. The portion 55 multiplies the data of the estimated interconnect wire length by the data of the resistance per unit interconnect wire length to electrically calculate the estimated wiring resistance.

The portion 57 electrically calculates the estimated delay value of each interconnect wire by using the data of the pin capacitance Cpi of the i-th macro cell to which the interconnect wire is connected, the sum Cp of the pin capacitances, the estimated wiring capacitance Cw, the estimated wiring resistance Rw, the fan-out n, and the coefficient A on the basis of the delay calculation expression=$(A/100)$ Rw $(Cw+Cp)+\{(100-A)/100\}^2$ $(1/n^2)$ Rw·Cw+$\{(100-A)/(100n)\}$Rw·Cpi. That is, the estimated interconnect delay value Tline(i) is calculated for each branch line BLi ($1 \leq i \leq n$) using the above described delay calculation expression in the third preferred embodiment. This requires a longer calculation time than that of the first and second preferred embodiments but increases the calculation accuracy of the estimated interconnect delay value of each interconnect wire.

According to the third preferred embodiment, as above described, the average value of the pin capacitances Cpi is not used but the pin capacitances Cpi are individually determined. Thus, the estimated interconnect delay value may be calculated with much higher accuracy than that of the first and second preferred embodiments, and a semiconductor integrated circuit may be designed with high accuracy if the operation of the circuit to be designed is increased.

(Fourth Preferred Embodiment)

The fourth preferred embodiment is an application of the technical principle of the second preferred embodiment to the third preferred embodiment.

The circuit model and the delay calculation expression thereof in the fourth preferred embodiment are similar to those in the third preferred embodiment. The user previously determines the coefficient A common to any fan-out by using the statistical technique from the past design data. In the third preferred embodiment, the coefficient A is selected for each fan-out n to calculate the estimated interconnect delay value. However, the apparatus according to the fourth preferred embodiment intactly uses the common coefficient A (constant) to calculate the estimated interconnect delay value on the basis of the delay calculation expression=$(A/100)$ Rw $(Cw+Cp)+\{(100-A)/100\}^2$ $(1/n^2)$ Rw·Cw+$\{(100-A)/(100n)\}$Rw·Cpi. The technical support (effectiveness) is based on FIG. 6.

Figure 12:
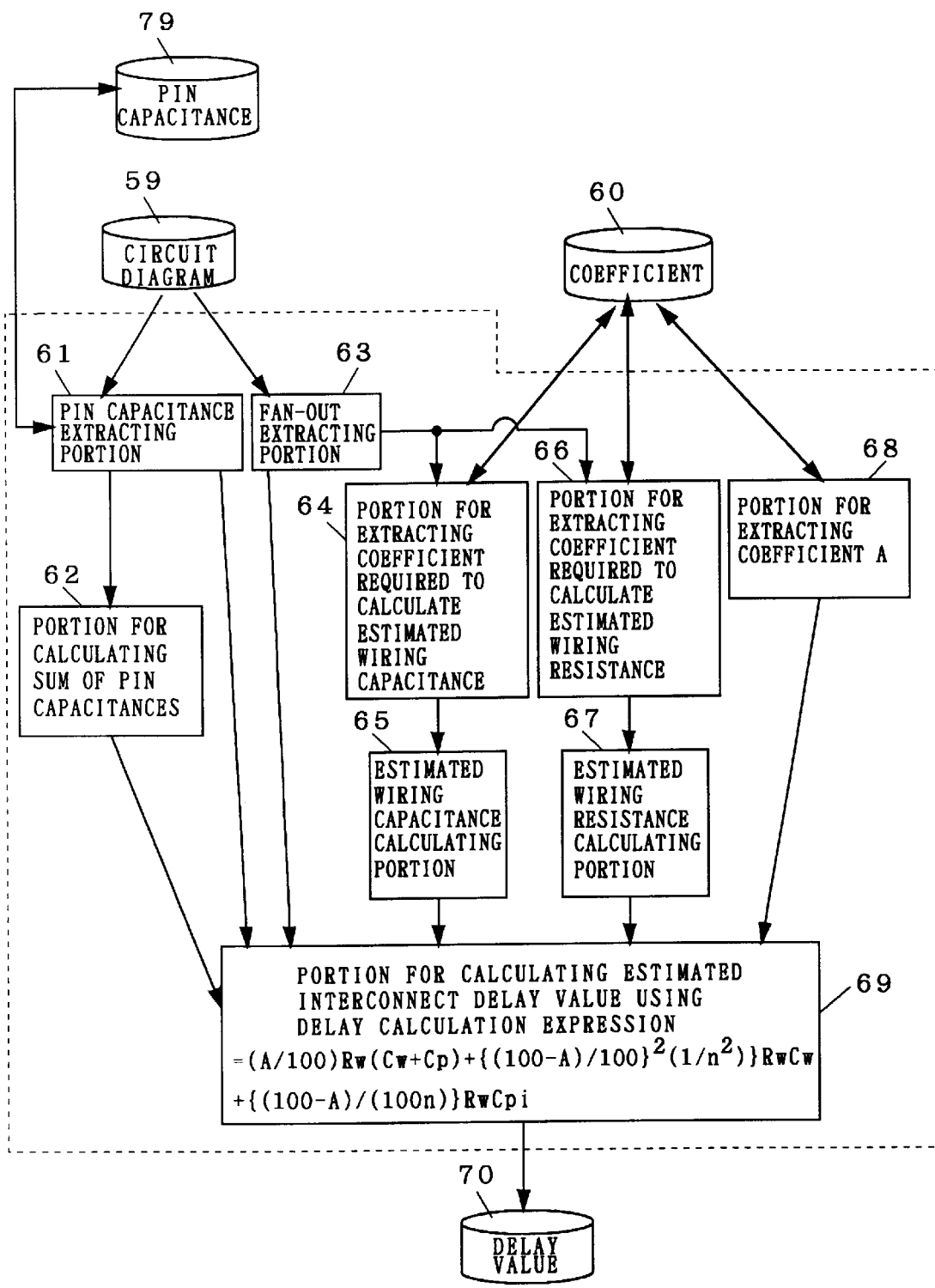
FIG. 12 is a block diagram of the delay calculation apparatus according to the fourth preferred embodiment.

FIG. 12 is a functional block diagram of the delay calculation apparatus for calculating the estimated interconnect delay on the basis of the above described circuit model. In FIG. 12, the reference numeral 59 designates a portion corresponding to the circuit diagram file portion 47 of FIG. 10; 60 designates a coefficient file portion for holding various coefficient table data required to calculate the interconnect delay value on the basis of the circuit model of FIG. 9. The files of the coefficient file portion 60 contain (1) the wiring resistance per unit interconnect wire length, (2) the wiring capacitance per unit interconnect wire length, (3) the estimated interconnect wire length for each fan-out, and (4) the coefficient A common to any fan-out, all of which are written in the form of table data. A coefficient of the linear expression by which the estimated interconnect wire length is calculated may be set in the coefficient file portion 60 in place of the estimated interconnect wire length for each fan-out n. The reference numerals 61, 79, 62, 63, 64, 65, 66, and 67 designate portions corresponding to the portions 49, 78, 50, 51, 52, 53, 54, and 55 of FIG. 10, respectively. The reference numeral 68 designates a portion corresponding to the portion 44 of FIG. 7.

The reference numeral 69 designates a portion for electrically calculating the estimated interconnect delay value by using the sum of the pin capacitances, the estimated wiring capacitance, the estimated wiring resistance, the coefficient A, and the fan-out on the basis of the delay calculation expression=$(A/100)$ Rw $(Cw+Cp)+\{(100-A)/100\}^2$ $(1/n^2)$ Rw·Cw+$\{(100-A)/(100n)\}$Rw·Cpi; and 70 designates an output file portion for storing the estimated interconnect delay values therein. A memory may be used in place of the portion 70 to store the estimated interconnect delay value therein.

Figure 13:
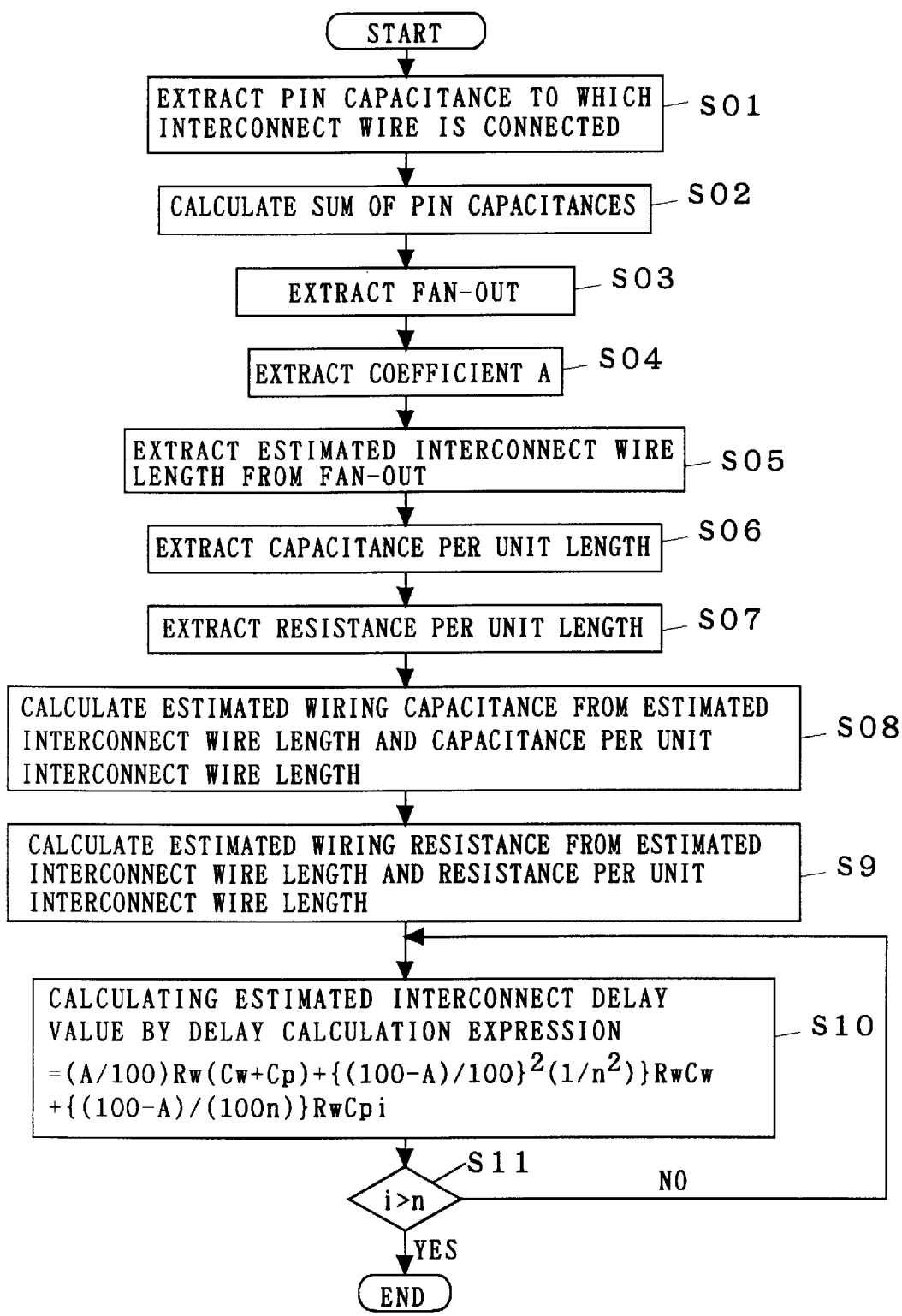
FIG. 13 illustrates the procedure of calculation of the estimated interconnect delay value according to the fourth preferred embodiment.

FIG. 13 is a flow chart illustrating the operation of the device of FIG. 12. FIG. 13 illustrates the procedure of calculation of the estimated delay value of each interconnect wire when the estimated interconnect wire length is set for each fan-out in the coefficient file portion 60.

In this procedure, the portion 61 initially accesses the portion 79 on the basis of the circuit diagram data extracted from the portion 59 to extract the pin capacitance of each macro cell to which the interconnect wire is connected. The portion 62 performs the operation of addition $\Sigma Cpi$ of the extracted pin capacitances Cpi to calculate the sum Cp of the pin capacitances.

The portion 63 extracts the data of the fan-out n from the portion 59. The portion 68 extracts the data of the common coefficient A from the file of the portion 60 on the basis of the data of the extracted fan-out n. The portion 64 extracts the data of the estimated interconnect wire length from the file of the coefficient file portion 60 on the basis of the extracted fan-out n. The portion 64 also extracts the data of the capacitance per unit interconnect wire length. The portion 66 similarly extracts the data of the resistance per unit interconnect wire length.

The portion 65 multiplies the data of the estimated interconnect wire length by the data of the capacitance per unit interconnect wire length to electrically calculate the estimated wiring capacitance. The portion 67 multiplies the data of the estimated interconnect wire length by the data of the resistance per unit interconnect wire length to electrically calculate the estimated wiring resistance.

The portion 69 electrically calculates the estimated delay value of each interconnect wire by using the respective data of the pin capacitance Cpi of the i-th macro cell to which the interconnect wire is connected, the sum Cp of the pin capacitances, the estimated wiring capacitance Cw, the estimated wiring resistance Rw, the fan-out n, and the coefficient A on the basis of the delay calculation expression=$(A/100)$ Rw $(Cw+Cp)+\{(100-A)/100\}^2$ $(1/n^2)$ Rw·Cw+$\{(100-A)/(100n)\}$Rw·Cpi to output the calculated value to the portion 70.

As above mentioned, the fourth preferred embodiment may add the advantage of the second preferred embodiment to the advantage of the third preferred embodiment while maintaining the advantage of the third preferred embodiment, permitting the calculation of the estimated interconnect delay value with higher accuracy at higher speeds.

(Fifth Preferred Embodiment)

The above described interconnect delay calculation apparatus of the first to fourth preferred embodiments may be applied to a portion for calculating the estimated interconnect delay value in an apparatus (path delay time verification apparatus) having the function of calculating a path delay value for an entire semiconductor integrated circuit (FIG. 14) comprising a plurality of macro cells and a plurality of interconnect wires for the macro cells. This allows the use of an accurately calculated estimated interconnect delay value during the calculation of the path delay value, improving the evaluation accuracy of the path delay value.

(Conclusion)

In the apparatus according to the first to fourth preferred embodiments of the present invention, the value of the coefficient A indicative of the percentage of the common portion and the branch portion of the interconnect wire permits the use of the intermediate circuit model between two circuit models which are poles apart, that is, the circuit model of Background Art 1 and the circuit model of Background Art 2. Thus, the apparatus may calculate the estimated interconnect delay value close to the actual interconnect delay value.

The first and third preferred embodiments use the data of the coefficient A for each fan-out to provide for accurate estimation of the estimated interconnect delay value.

The second preferred embodiment makes a modification to the technical principle of the first preferred embodiment in such a manner that the common coefficient A is used, eliminating the step of selecting the coefficient A. Thus, the second preferred embodiment provides for faster calculation than the first preferred embodiment while maintaining the calculation accuracy substantially similar to that of the first preferred embodiment.

The fourth preferred embodiment makes a modification to the technical principle of the third preferred embodiment in such a manner that the common coefficient A is used, eliminating the step of selecting the coefficient A. Thus, the fourth preferred embodiment provides for faster calculation than the third preferred embodiment while maintaining the calculation accuracy substantially similar to that of the third preferred embodiment.

In the fifth preferred embodiment, the use of the above described estimated interconnect delay value calculation apparatus during the calculation of the path delay value may improve the accuracy of the path delay value.

While the invention has been described in detail, the foregoing description is in all aspects illustrative and not restrictive. It is understood that numerous other modifications and variations can be devised without departing from the scope of the invention.

We claim:

1. An interconnect delay calculation apparatus for calculating estimated interconnect delay values for an interconnect wire length when an output of a first macro cell is connected to inputs of n second macro cells ($n \geq 1$) in designing a semiconductor integrated circuit, said interconnect delay calculation apparatus comprising:

storage means for electrically storing therein predetermined data about a circuit model designed for said interconnect wire length and consisting essentially of a common portion and a branch portion with a fan-out of n, said common portion having a first resistance connected between said output of said first macro cell and a branch point, and a first capacitance connected between said branch point and ground, said branch portion including branch interconnect wires for connecting said branch point to said n second macro cells, respectively, and uniformly branched for the fan-out of n, each of said branch interconnect wires having a second resistance connected between said branch point and the input of a corresponding one of said second macro cells, a second capacitance serving as a parasitic capacitance and connected between the input of the corresponding one of said second macro cells and the ground, and a pin capacitance connected between the input of the corresponding one of said second macro cells and the ground, and calculating means for electrically calculating said estimated interconnect delay values using a predetermined delay calculation expression specified by time constants of said first and second resistances, said first and second capacitances, and said pin capacitance on the basis of said predetermined data extracted from said storage means.

2. The interconnect delay calculation apparatus of claim 1, wherein the lengths of said common portion and said branch portion are defined on a percentage basis respectively as a first coefficient and 100 minus said first coefficient, based upon said interconnect wire length of said circuit model, wherein said first resistance, said second resistance, said first capacitance, and said second capacitance are defined respectively as said first coefficient times an estimated wiring resistance divided by 100, the quantity 100 minus said first coefficient times said estimated wiring resistance divided by 100n, said first coefficient times an estimated wiring capacitance divided by 100, and the quantity 100 minus said first coefficient times said estimated wiring capacitance divided by 100n, wherein said storage means comprises first storage means for storing therein circuit diagram data when said circuit model is applied to said interconnect wire length to be designed for said semiconductor integrated circuit, second storage means for storing therein data about said pin capacitance for a plurality of types of semiconductor devices usable as said second macro cells as a library, and third storage means for storing therein first coefficient table data indicative of information about said first coefficient, second coefficient table data indicative of a wiring resistance per unit interconnect wire length, third coefficient table data indicative of a wiring capacitance per unit interconnect wire length, and fourth coefficient table data indicative of an estimated interconnect wire length for each fan-out, said circuit diagram data comprising both data about type information and pin information of said second macro cells contained in said interconnect wire length to be designed, and data about said fan-out of said interconnect wire length to be designed, said estimated interconnect wire length being equal to the sum of the length of said common portion and the length of said branch portion, said first and fourth coefficient table data being previously determined by a statistical technique, and wherein said calculating means comprises first extracting means for extracting the data about said type information and said pin information of said second macro cells from said first storage means to extract said pin capacitance data of said second macro cells from said second storage means on the basis of the extracted data, first calculating means for electrically calculating the sum of said pin capacitance data extracted from said first extracting means, second extracting means for extracting said fan-out data from said first storage means, second calculating means for extracting corresponding ones of said first, second, third, and fourth coefficient table data from said third storage means on the basis of said fan-out data extracted by said second extracting means to electrically determine said extracted second, third, and fourth coefficient table data as second, third, and fourth coefficient data, respectively, to electrically calculate data of said estimated wiring resistance and data of said estimated wiring capacitance on the basis of the multiplication of said second and fourth coefficient data and the multiplication of said third and fourth coefficient data, respectively, and to electrically determine first coefficient data indicative of said first coefficient for said interconnect wire length to be designed on the basis of said first coefficient table data, and third calculating means for electrically calculating said estimated interconnect delay values on the basis of output signals from said first and second calculating means by using said predetermined delay calculation expression specified based on said first coefficient data, said estimated wiring resistance data, said estimated wiring capacitance data, said pin capacitance sum data, and said fan-out data.

3. The interconnect delay calculation apparatus of claim 2, wherein said first coefficient table data are previously determined for each fan-out by the statistical technique, and wherein said second calculating means comprises first coefficient determining means for selecting the presence/absence of said first coefficient table data corresponding to said fan-out on the basis of said fan-out data, said first coefficient determining means electrically determining said first coefficient table data as said first coefficient data required for calculation when said corresponding first coefficient table data are present, said first coefficient determining means electrically determining said first coefficient data required for calculation by electrical processing using linear interpolation when said corresponding first coefficient table data are absent.

4. The interconnect delay calculation apparatus of claim 2, wherein said first coefficient table data are comprised of only constant data common to any fan-out and determined previously by the statistical technique, and wherein said second calculating means comprises
first coefficient determining means for selecting said first coefficient table data on the basis of said fan-out data to electrically determine said first coefficient table data as said first coefficient data required for calculation.

5. The interconnect delay calculation apparatus of claim 2, wherein said pin capacitance of each of said second macro cells in said circuit model is given by said pin capacitance sum data divided by said fan-out data, and wherein said third calculating means comprises
estimated interconnect delay value calculating means for electrically calculating said estimated interconnect delay values on the basis of the output signals from said first and second calculating means by using said predetermined delay calculation expression specified by said first coefficient data, said estimated wiring resistance data, said estimated wiring capacitance data, said pin capacitance sum data divided by said fan-out data, and said fan-out data.

6. The interconnect delay calculation apparatus of claim 3, wherein said pin capacitance of each of said second macro cells in said circuit model is given by said pin capacitance sum data divided by said fan-out data, and wherein said third calculating means comprises
estimated interconnect delay value calculating means for electrically calculating said estimated interconnect delay values on the basis of the output signals from said first and second calculating means by using said predetermined delay calculation expression specified by said first coefficient data, said estimated wiring resistance data, said estimated wiring capacitance data, said pin capacitance sum data divided by said fan-out data, and said fan-out data.

7. The interconnect delay calculation apparatus of claim 4, wherein said pin capacitance of each of said second macro cells in said circuit model is given by said pin capacitance sum data divided by said fan-out data, and wherein said third calculating means comprises
estimated interconnect delay value calculating means for electrically calculating said estimated interconnect delay values on the basis of the output signals from said first and second calculating means by using said predetermined delay calculation expression specified by said first coefficient data, said estimated wiring resistance data, said estimated wiring capacitance data, said pin capacitance sum data divided by said fan-out data, and said fan-out data.

8. The interconnect delay calculation apparatus of claim 2, wherein said pin capacitance of each of said second macro cells in said circuit model is given by corresponding ones of said pin capacitance data extracted by said first extracting means, and wherein said third calculating means comprises
estimated interconnect delay value calculating means for electrically calculating each of said estimated interconnect delay values on the basis of the output signals from said first and second calculating means and an output signal of each of said pin capacitance data extracted by said first extracting means by using said predetermined delay calculation expression specified based on said first coefficient data, said estimated wiring resistance data, said estimated wiring capacitance data, said pin capacitance sum data, said fan-out data, and each of said pin capacitance data.

9. The interconnect delay calculation apparatus of claim 3, wherein said pin capacitance of each of said second macro cells in said circuit model is given by corresponding ones of said pin capacitance data extracted by said first extracting means, and wherein said third calculating means comprises
estimated interconnect delay value calculating means for electrically calculating each of said estimated interconnect delay values on the basis of the output signals from said first and second calculating means and an output signal of each of said pin capacitance data extracted by said first extracting means by using said predetermined delay calculation expression specified based on said first coefficient data, said estimated wiring resistance data, said estimated wiring capacitance data, said pin capacitance sum data, said fan-out data, and each of said pin capacitance data.

10. The interconnect delay calculation apparatus of claim 4, wherein said pin capacitance of each of said second macro cells in said circuit model is given by corresponding ones of said pin capacitance data extracted by said first extracting means, and wherein said third calculating means comprises
estimated interconnect delay value calculating means for electrically calculating each of said estimated interconnect delay values on the basis of the output signals from said first and second calculating means and an output signal of each of said pin capacitance data extracted by said first extracting means by using said predetermined delay calculation expression specified based on said first coefficient data, said estimated wiring resistance data, said estimated wiring capacitance data, said pin capacitance sum data, said fan-out data, and each of said pin capacitance data.

11. A path delay value verification apparatus for functioning to calculate a path delay value of a semiconductor integrated circuit when said semiconductor integrated circuit is designed, said path delay value verification apparatus comprising an interconnect delay calculation apparatus, said path delay value verification apparatus using said interconnect delay calculation apparatus to electrically calculate estimated interconnect delay values of individual interconnect wire lengths in said semiconductor integrated circuit, said interconnect delay calculation apparatus calculating estimated interconnect delay values for an interconnect wire length when an output of a first macro cell is connected to inputs of n second macro cells (n≧1) in designing said semiconductor integrated circuit, said interconnect delay calculation apparatus comprising:

storage means for electrically storing therein predetermined data about a circuit model designed for said interconnect wire length and consisting essentially of a common portion and a branch portion with a fan-out of n, said common portion having a first resistance connected between said output of said first macro cell and a branch point, and a first capacitance connected between said branch point and ground, said branch portion including branch interconnect wires for connecting said branch point to said n second macro cells, respectively, and uniformly branched for the fan-out of n, each of said branch interconnect wires having a second resistance connected between said branch point and the input of a corresponding one of said second macro cells, a second capacitance serving as a parasitic capacitance and connected between the input of the corresponding one of said second macro cells and the ground, and a pin capacitance connected between the input of the corresponding one of said second macro cells and the ground, and calculating means for electrically calculating said estimated interconnect delay values using a predetermined delay calculation expression specified by time constants of said first and second resistances, said first and second capacitances, and said pin capacitance on the basis of said predetermined data extracted from said storage means.

12. A circuit model data storage device for electrically holding predetermined data for calculating estimated interconnect delay values of a semiconductor integrated circuit, wherein said predetermined data are data indicative of respective portions of a circuit model, wherein said circuit model is designed for an interconnect wire length when an output of a first macro cell is connected to inputs of n second macro cells (n≧1), and consists essentially of a common portion and a branch portion with a fan-out of n, said common portion having a first resistance connected between said output of said first macro cell and a branch point, and a first capacitance connected between said branch point and ground, said branch portion including branch interconnect wires for connecting said branch point to said n second macro cells, respectively, and uniformly branched for the fan-out of n, each of said branch interconnect wires having a second resistance connected between said branch point and the input of a corresponding one of said second macro cells, a second capacitance serving as a parasitic capacitance and connected between the input of the corresponding one of said second macro cells and the ground, and a pin capacitance connected between the input of the corresponding one of said second macro cells and the ground, and wherein said data indicative of said respective portions correspond to data about said first and second resistances, said first and second capacitances, said pin capacitance, said fan-out, and the proportions of said common portion and said branch portion, based upon said interconnect wire length.

13. The circuit model data storage device of claim 12, wherein the lengths of said common portion and said branch portion are defined on a percentage basis respectively as a first coefficient and 100 minus said first coefficient, based upon said interconnect wire length of said circuit model, wherein said first resistance, said second resistance, said first capacitance, and said second capacitance are defined respectively as said first coefficient times an estimated wiring resistance divided by 100, the quantity 100 minus said first coefficient times said estimated wiring resistance divided by 100n, said first coefficient times an estimated wiring capacitance divided by 100, and the quantity 100 minus said first coefficient times said estimated wiring capacitance divided by 100n, and wherein said predetermined data comprise
circuit diagram data,
data about said pin capacitance for a plurality of types of semiconductor devices usable as said second macro cells,
first coefficient table data indicative of information about said first coefficient,
second coefficient table data indicative of a wiring resistance per unit interconnect wire length,
third coefficient table data indicative of a wiring capacitance per unit interconnect wire length, and
fourth coefficient table data indicative of an estimated interconnect wire length for each fan-out, said circuit diagram data comprising both data about type information and pin information of said second macro cells contained in said interconnect wire length to be designed, and data about said fan-out of said interconnect wire length to be designed, said estimated interconnect wire length being equal to the sum of the length of said common portion and the length of said branch portion, said first and fourth coefficient table data being previously determined by a statistical technique.

* * * * *